United States Patent
Seo et al.

(10) Patent No.: US 10,531,581 B2
(45) Date of Patent: Jan. 7, 2020

(54) DISPLAY APPARATUS

(71) Applicant: LG ELECTRONICS INC., Seoul (KR)

(72) Inventors: Dongsung Seo, Seoul (KR); Woosik Jung, Seoul (KR); Yoontai Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/795,148

(22) Filed: Oct. 26, 2017

(65) Prior Publication Data

US 2018/0124932 A1 May 3, 2018

(30) Foreign Application Priority Data

Oct. 28, 2016 (KR) .................. 10-2016-0142223
Dec. 9, 2016 (KR) .................. 10-2016-0167364

(51) Int. Cl.
*H05K 5/00* (2006.01)
*H01L 25/10* (2006.01)
(Continued)

(52) U.S. Cl.
CPC ......... *H05K 5/0017* (2013.01); *G09F 9/3026* (2013.01); *H01L 25/105* (2013.01); *H05K 5/0026* (2013.01); *H01L 27/156* (2013.01)

(58) Field of Classification Search
CPC .................... H05K 5/0026; G09F 9/3026
See application file for complete search history.

(56) References Cited

U.S. PATENT DOCUMENTS 5,262,759 A * 11/1993 Moriconi .............. G06F 1/1616
361/679.29
5,928,320 A * 7/1999 Forsythe ............... G06F 1/1601
361/679.08
(Continued)

FOREIGN PATENT DOCUMENTS

CN          105485105        4/2016
EP            3054369         8/2016

OTHER PUBLICATIONS

European Patent Office Application Serial No. 17198434.7, Search Report dated Apr. 11, 2018, 8 pages.

*Primary Examiner* — Hoa C Nguyen
*Assistant Examiner* — Keith DePew
(74) *Attorney, Agent, or Firm* — Lee, Hong, Degerman, Kang & Waimey PC

(57) ABSTRACT

Disclosed is a structure for finely adjusting the distance between image output portions constituted by a plurality of panels or modules of a display apparatus. The display apparatus includes a display panel including a first panel module and a second panel module arranged in a vertical plane for outputting images forward, a support frame disposed at the rear of the display panel for supporting the display panel, and a control unit disposed at the rear of the display panel for controlling the outputting the images from the display panel. The display apparatus further includes a connection unit, a receiving unit, and an adjustment unit for finely adjusting the distance between the display modules. In addition, the display apparatus further includes a recess part and a protrusion part, which are movably coupled to each other for circuit connection, in order to enable fine adjustment of the distance between the display panel modules of the display panel.

19 Claims, 19 Drawing Sheets

(51) Int. Cl.
*G09F 9/302* (2006.01)
*H01L 27/15* (2006.01)

(56) References Cited

U.S. PATENT DOCUMENTS

| | | | | |
|---|---|---|---|---|
| 9,854,701 B2* | 12/2017 | Choi | ............ | F16M 11/043 |
| 2007/0000849 A1* | 1/2007 | Lutz | ............ | G09F 9/33 |
| | | | | 211/26 |
| 2008/0263924 A1* | 10/2008 | Nearman | ............ | G09F 9/30 |
| | | | | 40/607.13 |
| 2010/0090934 A1* | 4/2010 | Elliott | ............ | G09F 9/33 |
| | | | | 345/82 |
| 2012/0260483 A1* | 10/2012 | Patterson | ............ | G06F 3/1446 |
| | | | | 29/428 |
| 2016/0231976 A1* | 8/2016 | Ryu | ............ | G09G 3/30 |

* cited by examiner

[FIG. 1]
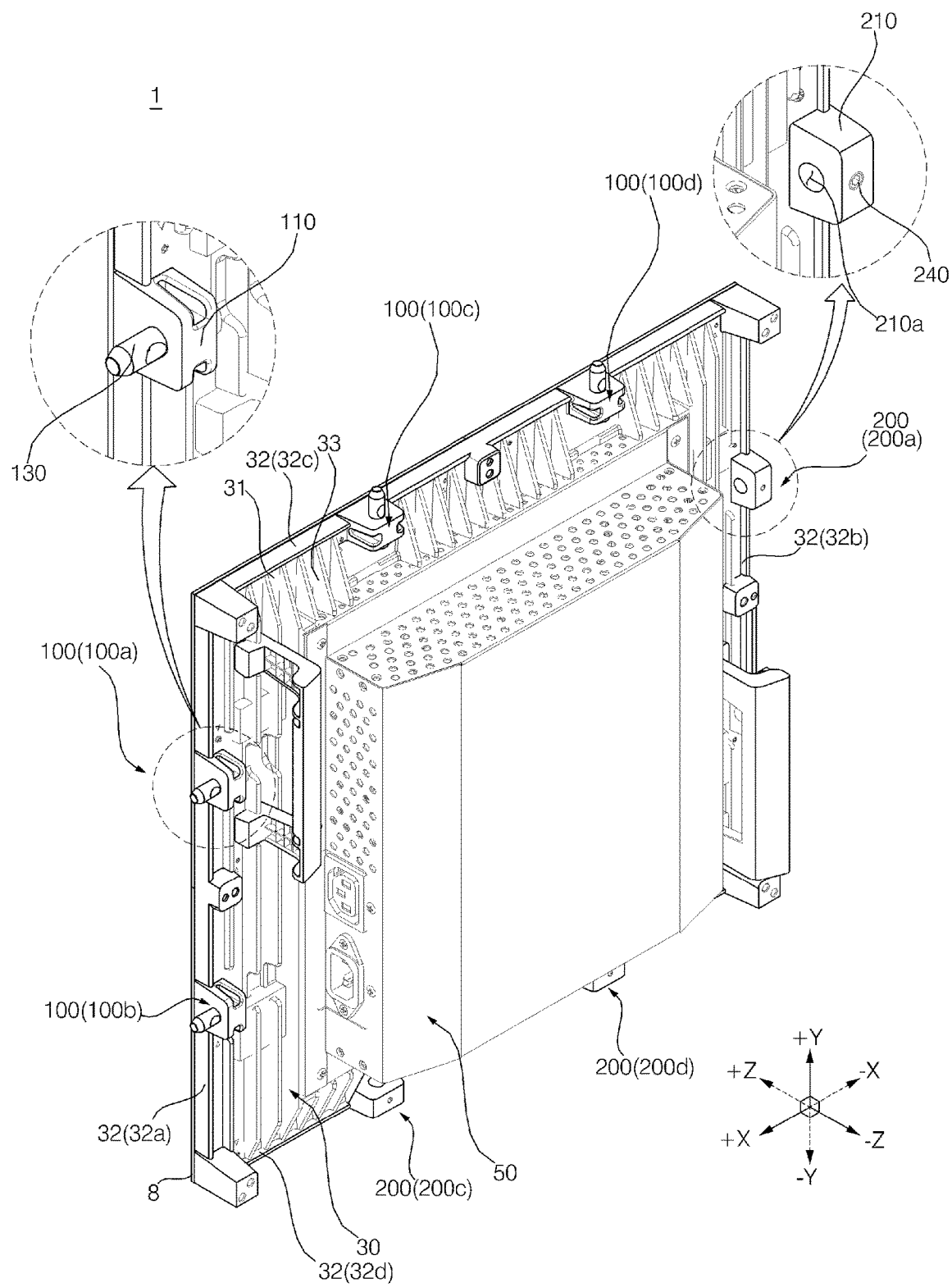

[FIG. 2]
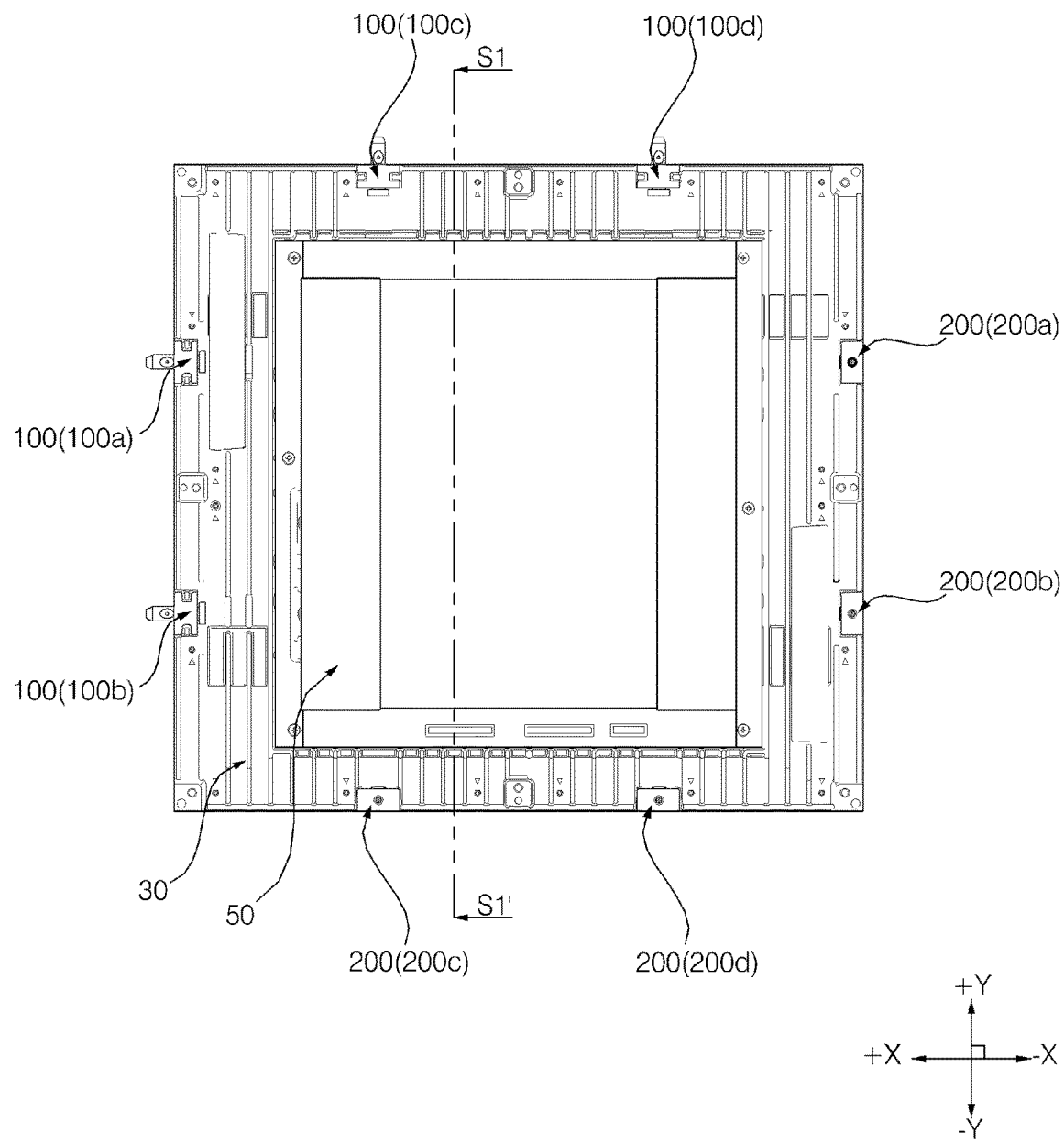

[FIG. 3]
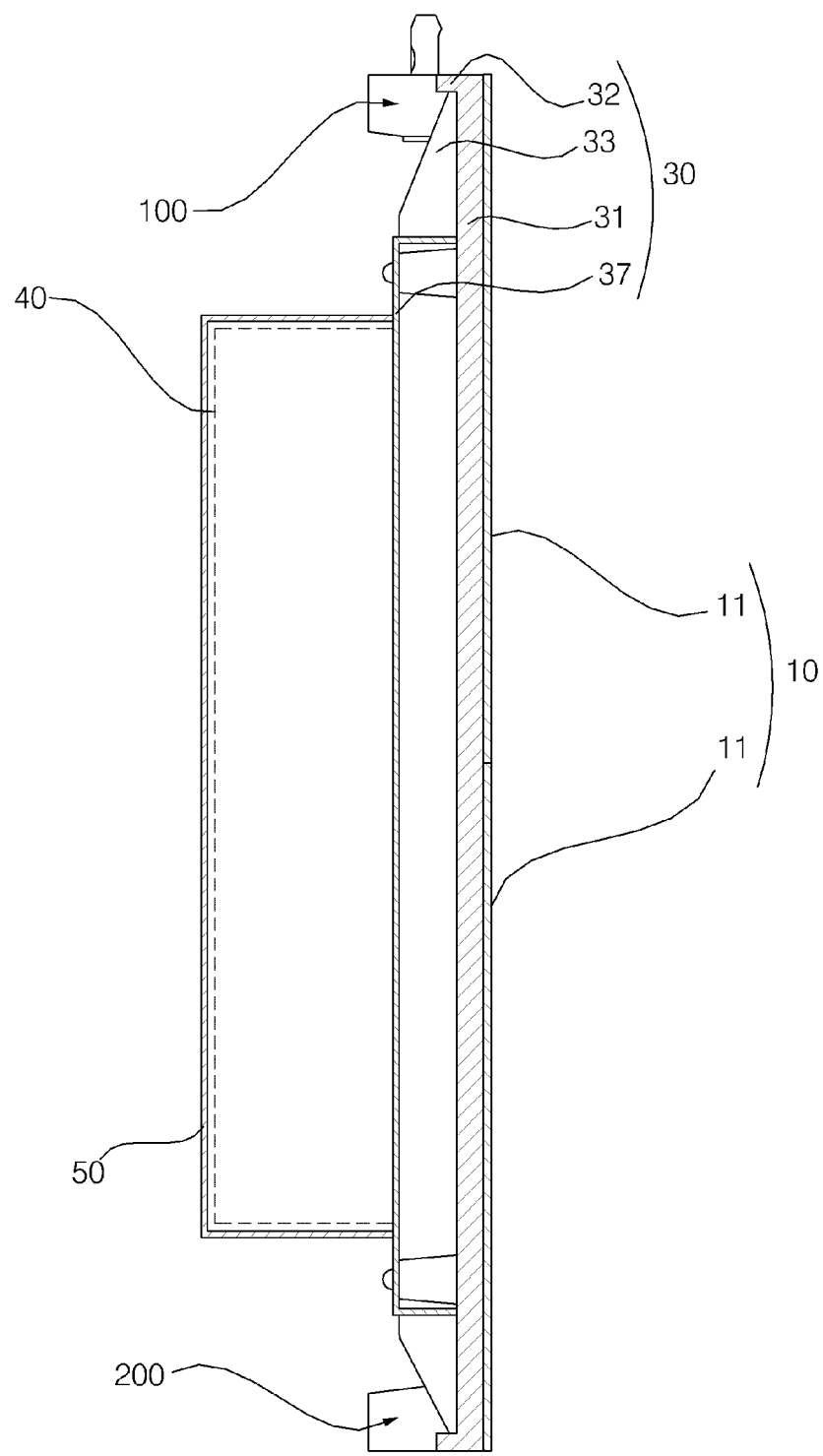

[FIG. 4]
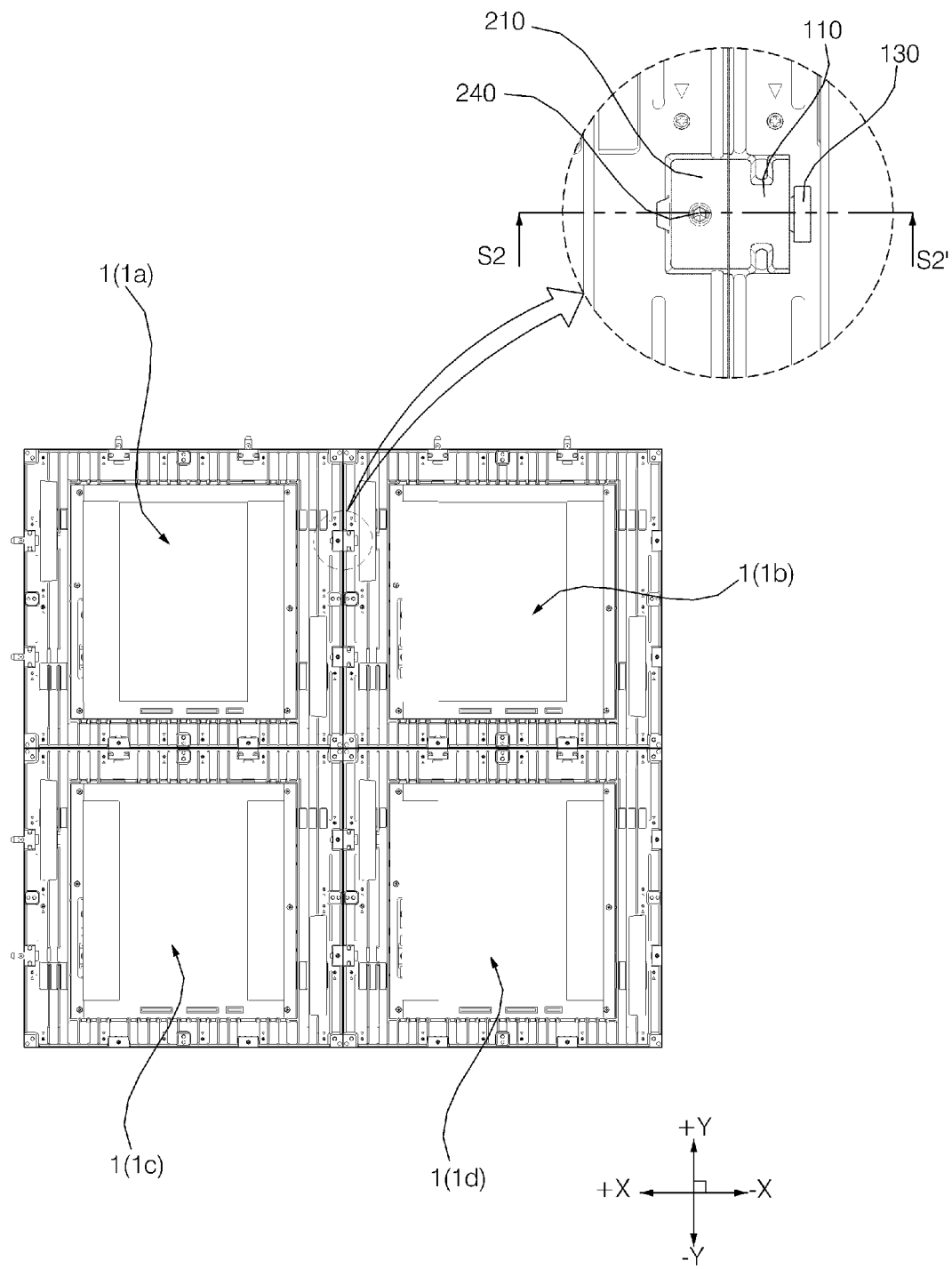

【FIG. 5】
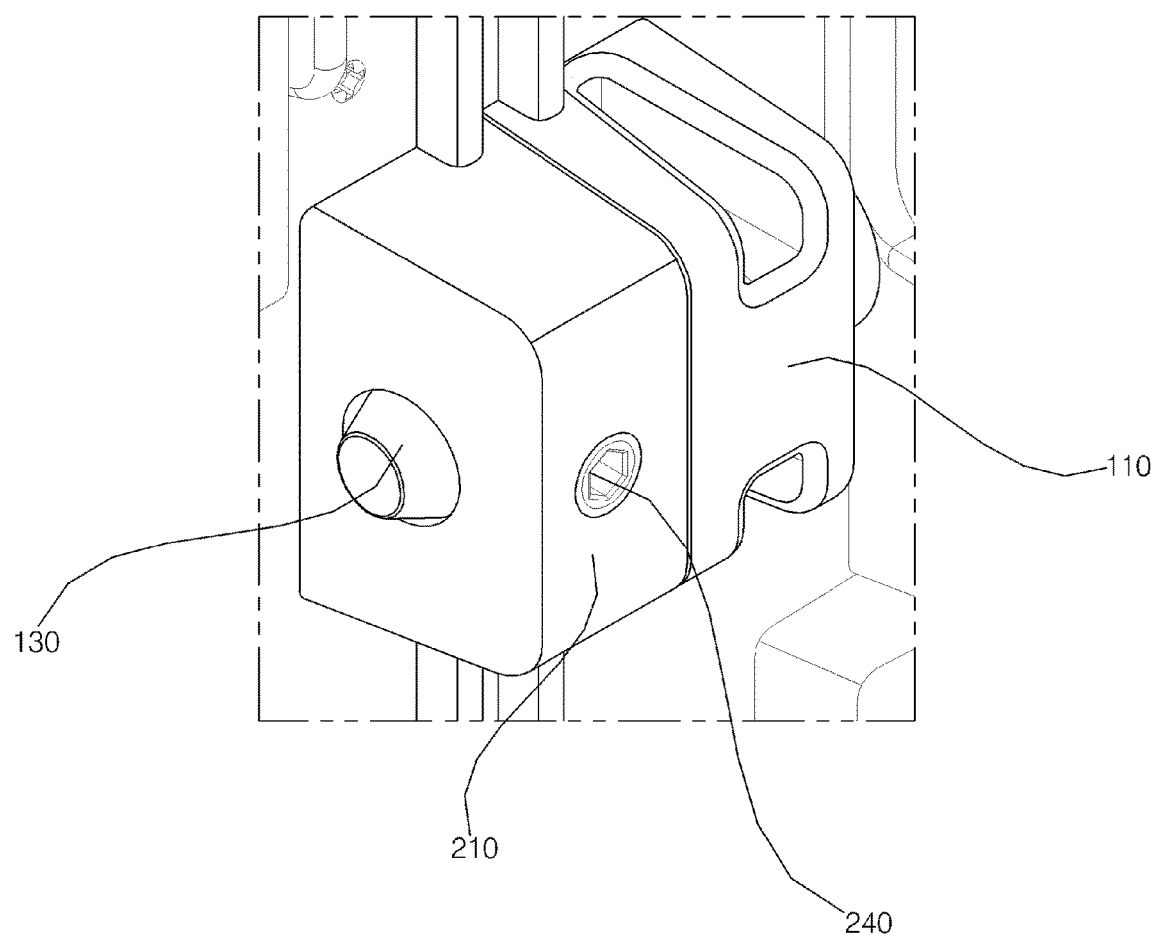

[FIG. 6]
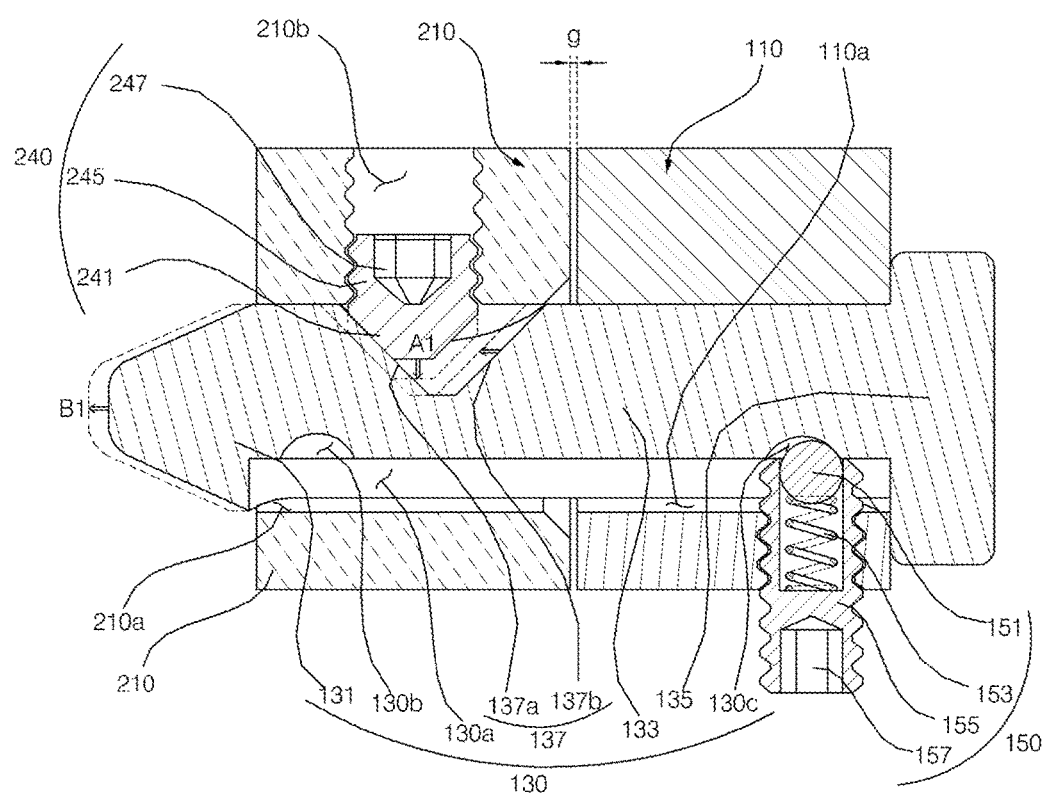

[FIG. 7]
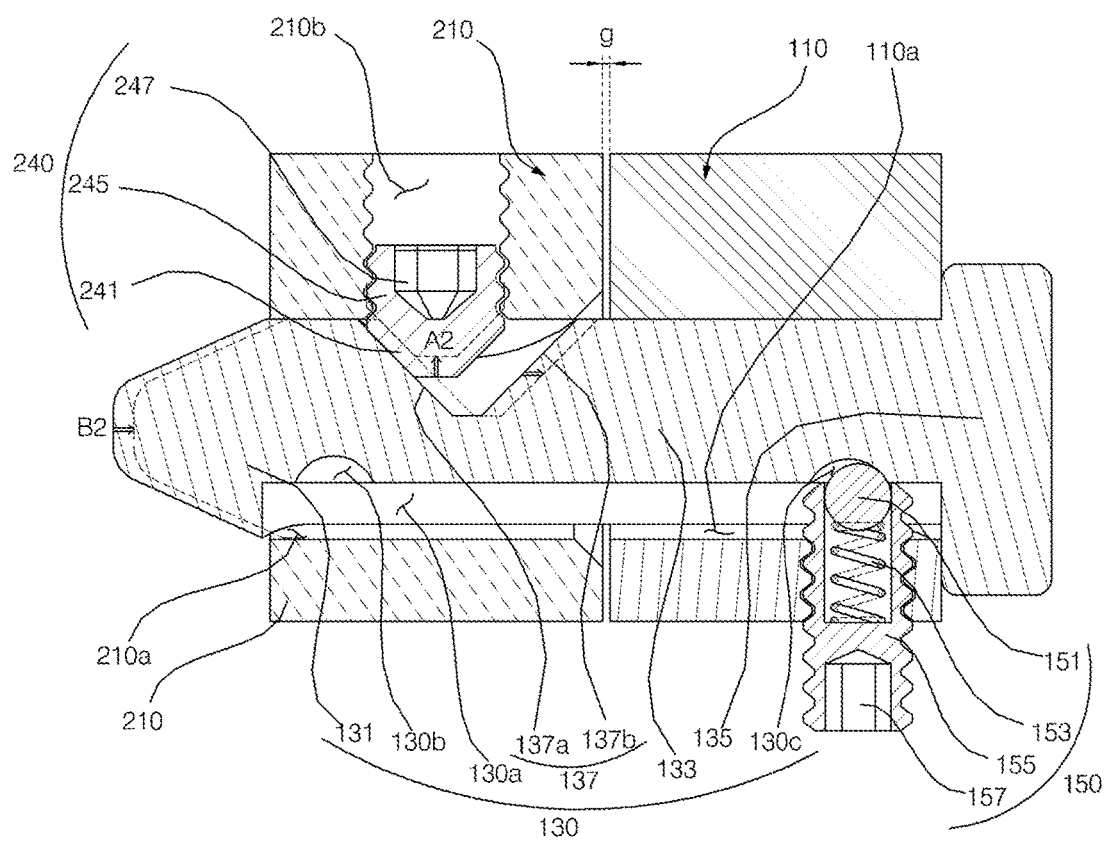

[FIG. 8]
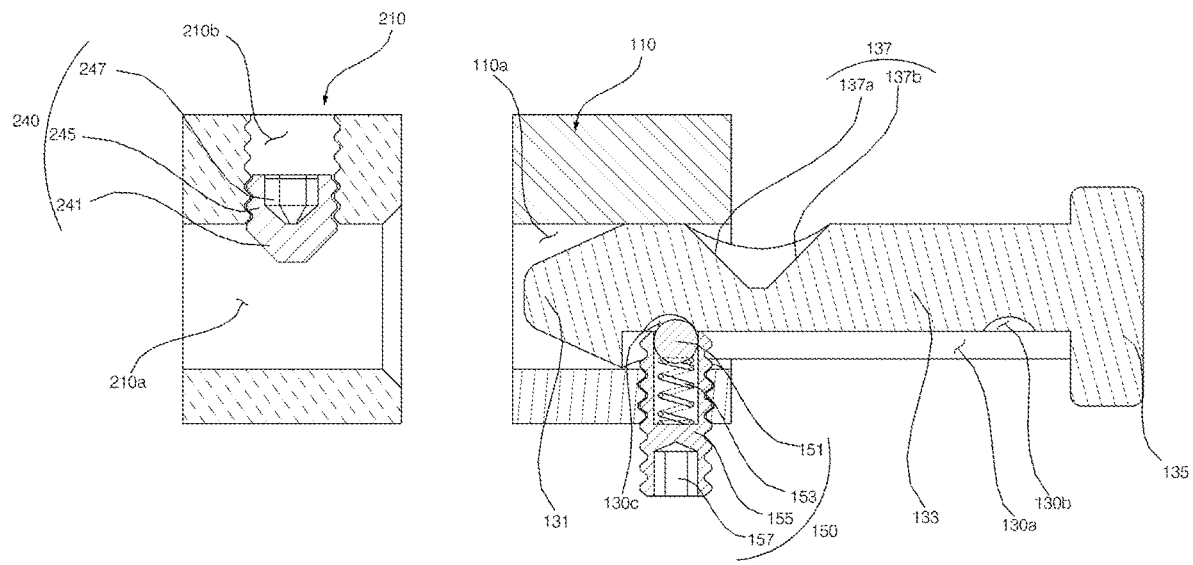
[FIG. 9A]
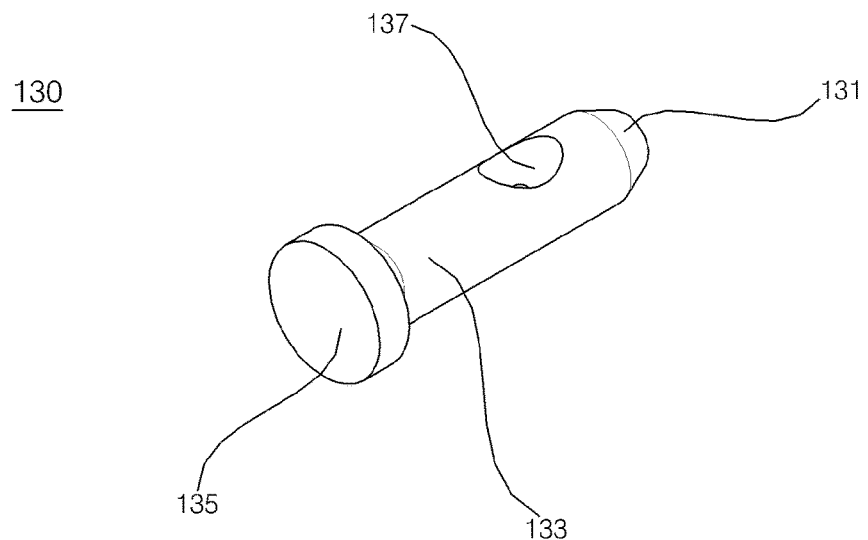

【FIG. 9B】
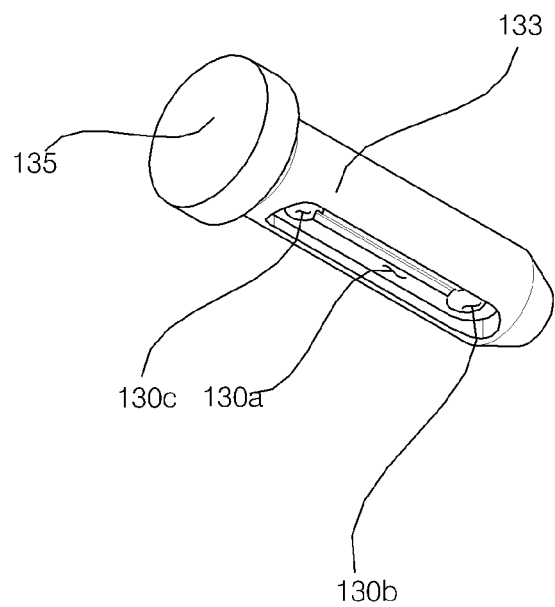

[FIG. 10]
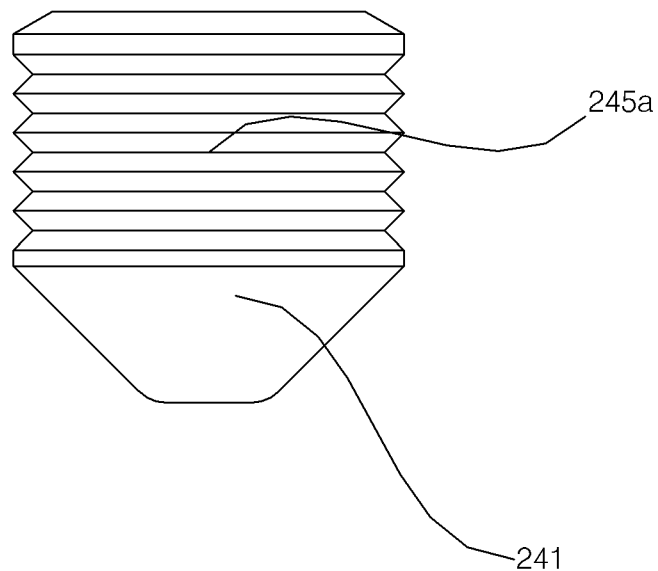

[FIG. 11A]
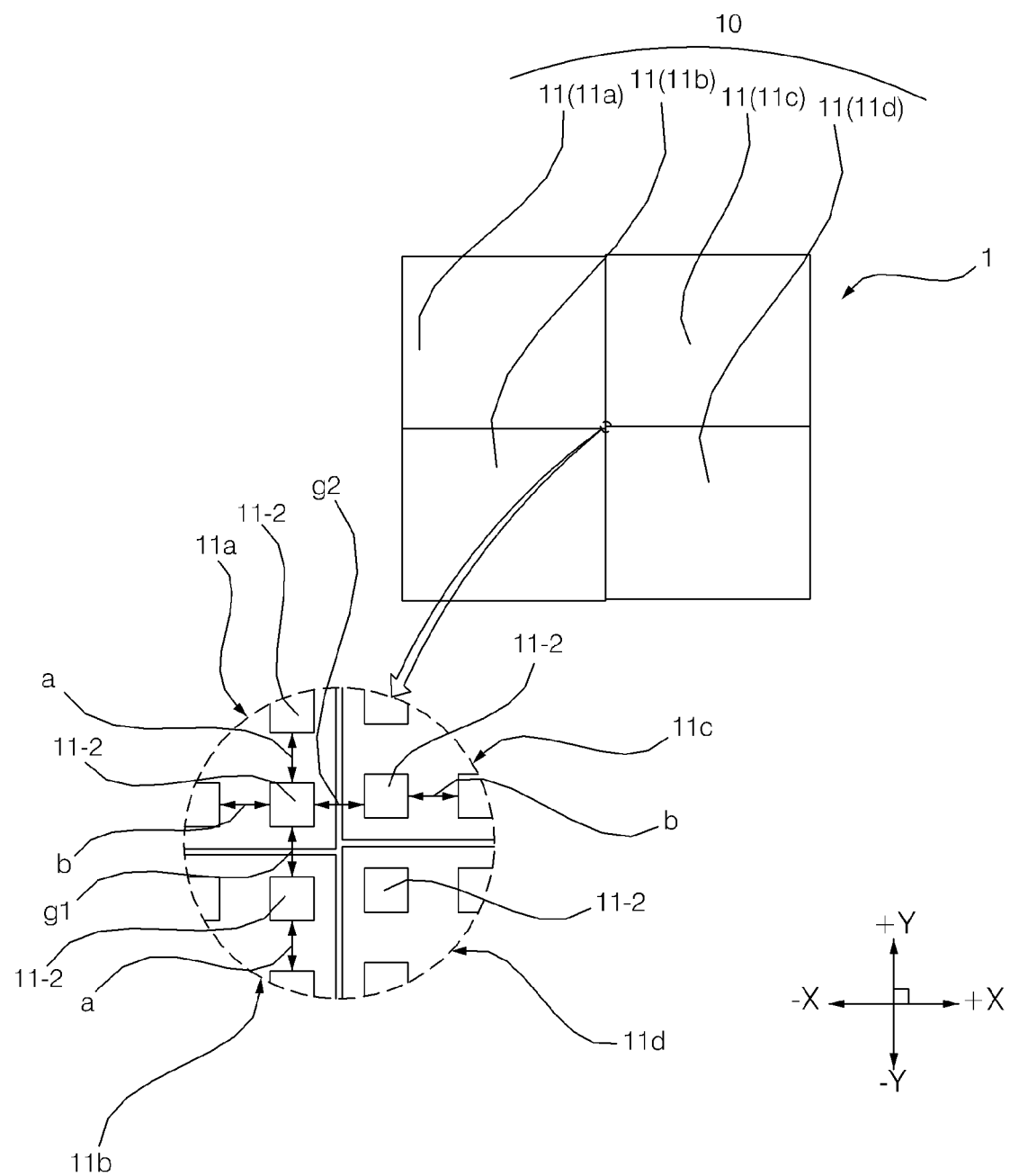

【FIG. 11B】
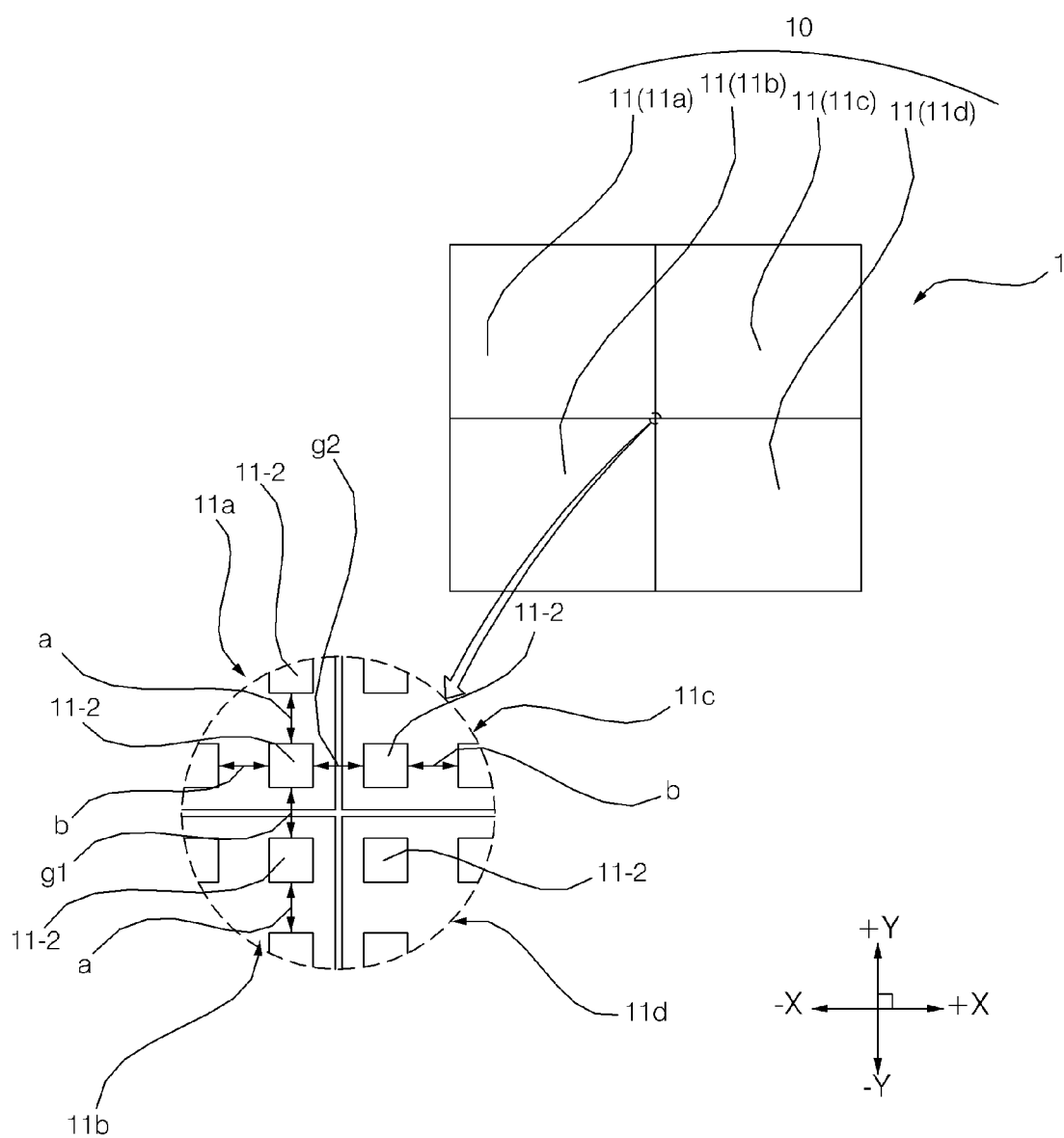

【FIG. 12A】
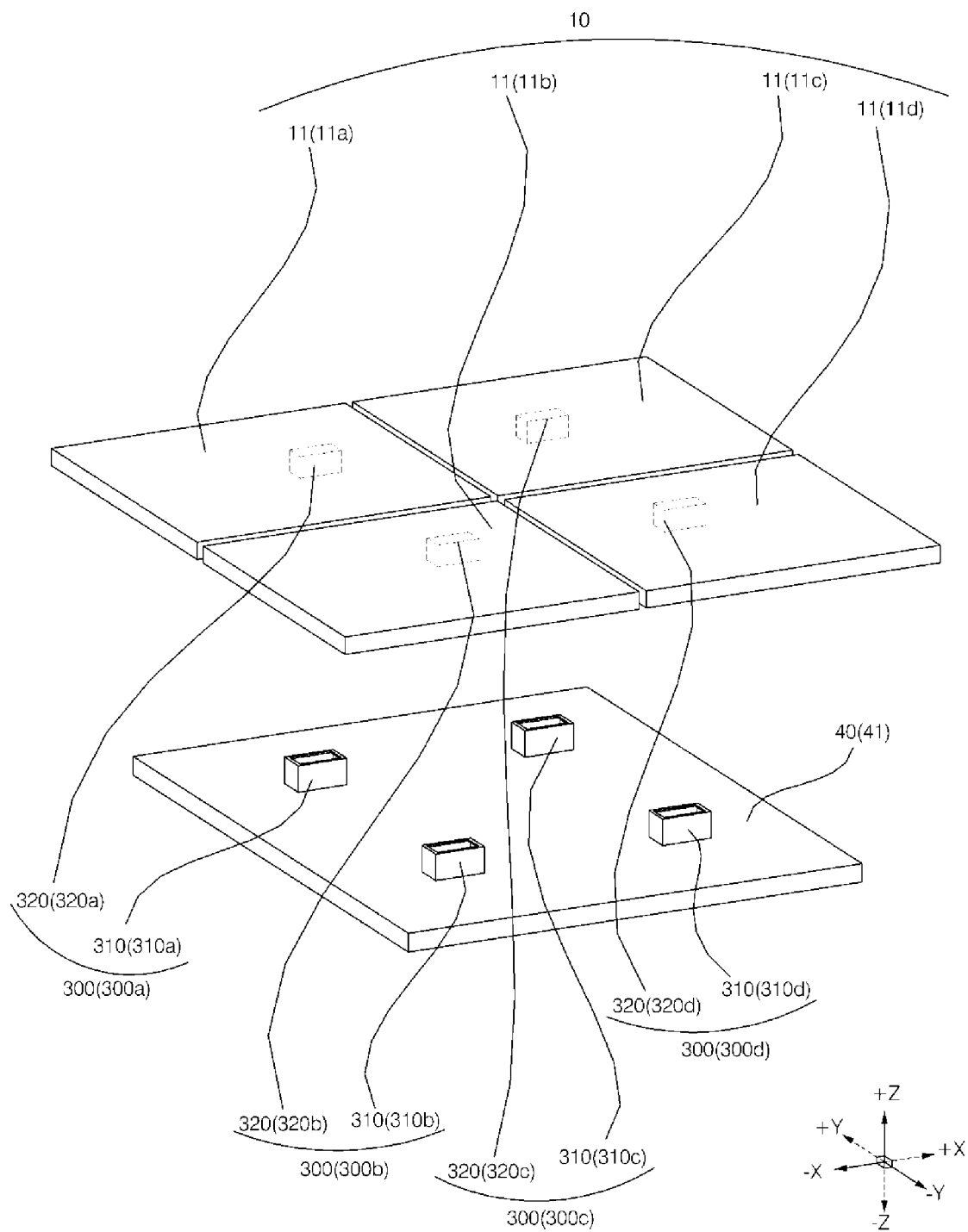

[FIG. 12B]
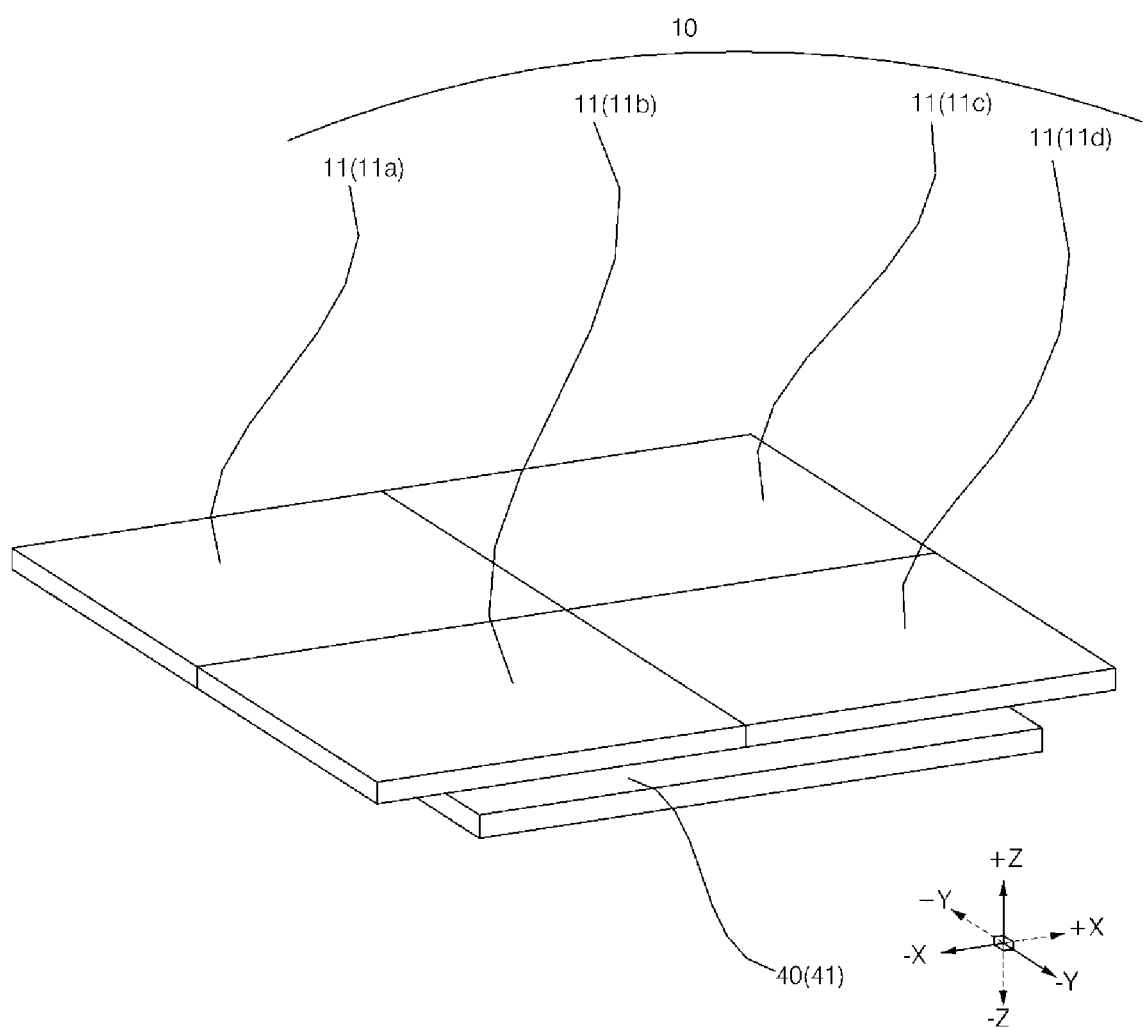

【FIG. 13】
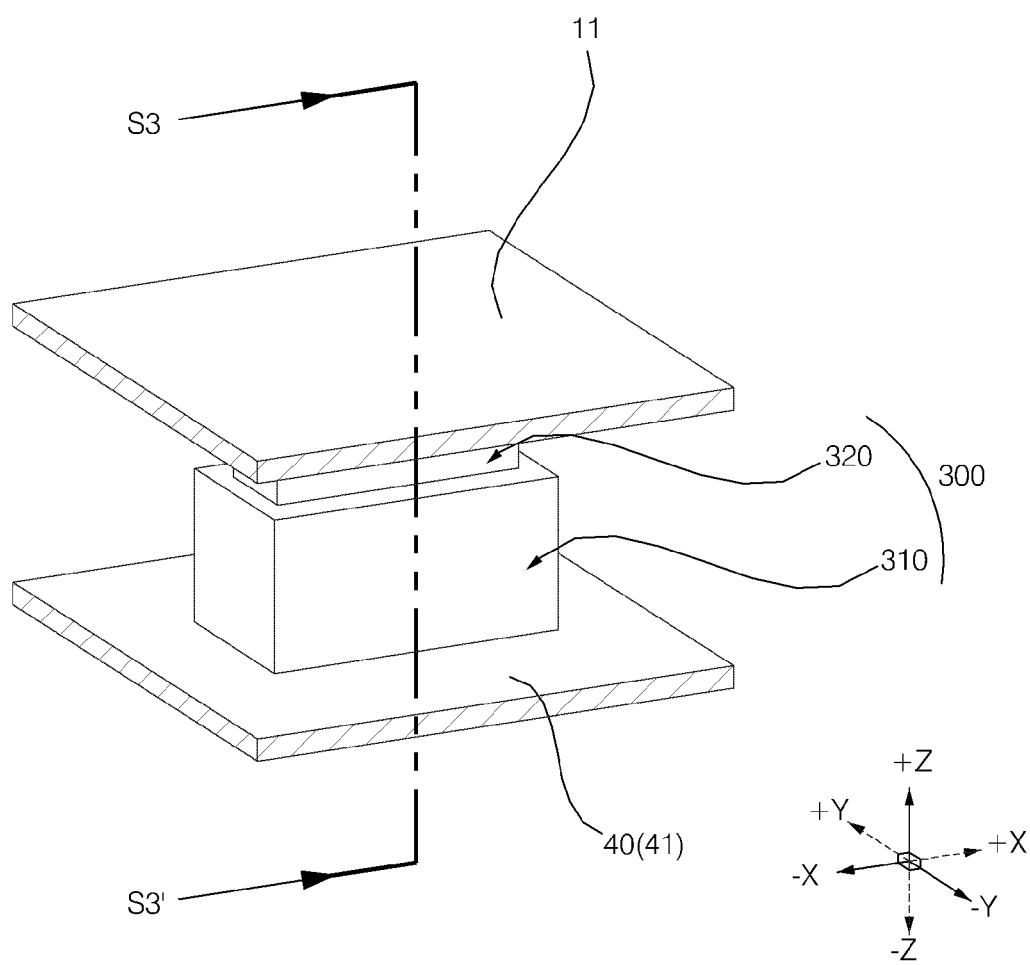

【FIG. 14】
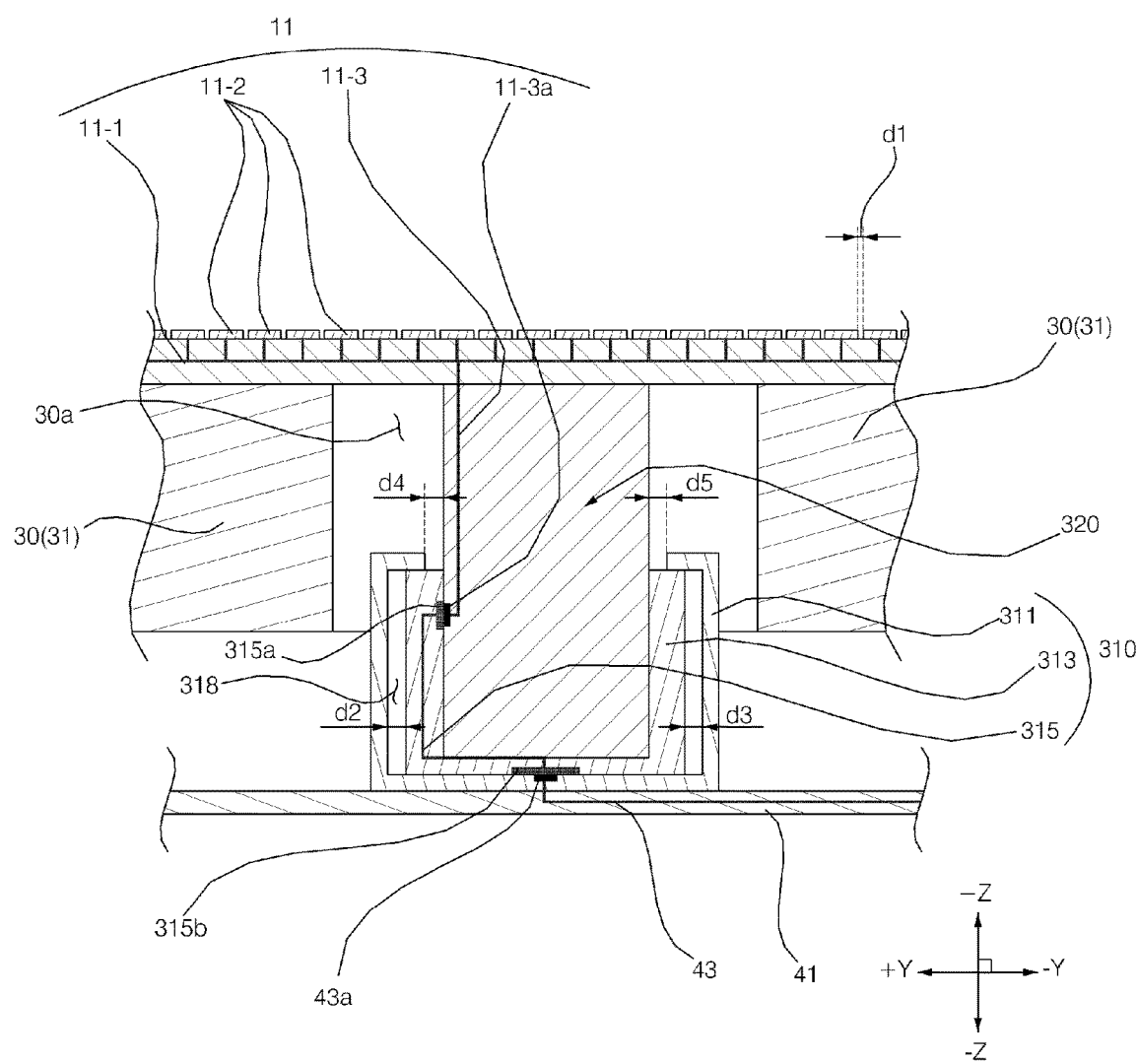

[FIG. 15]
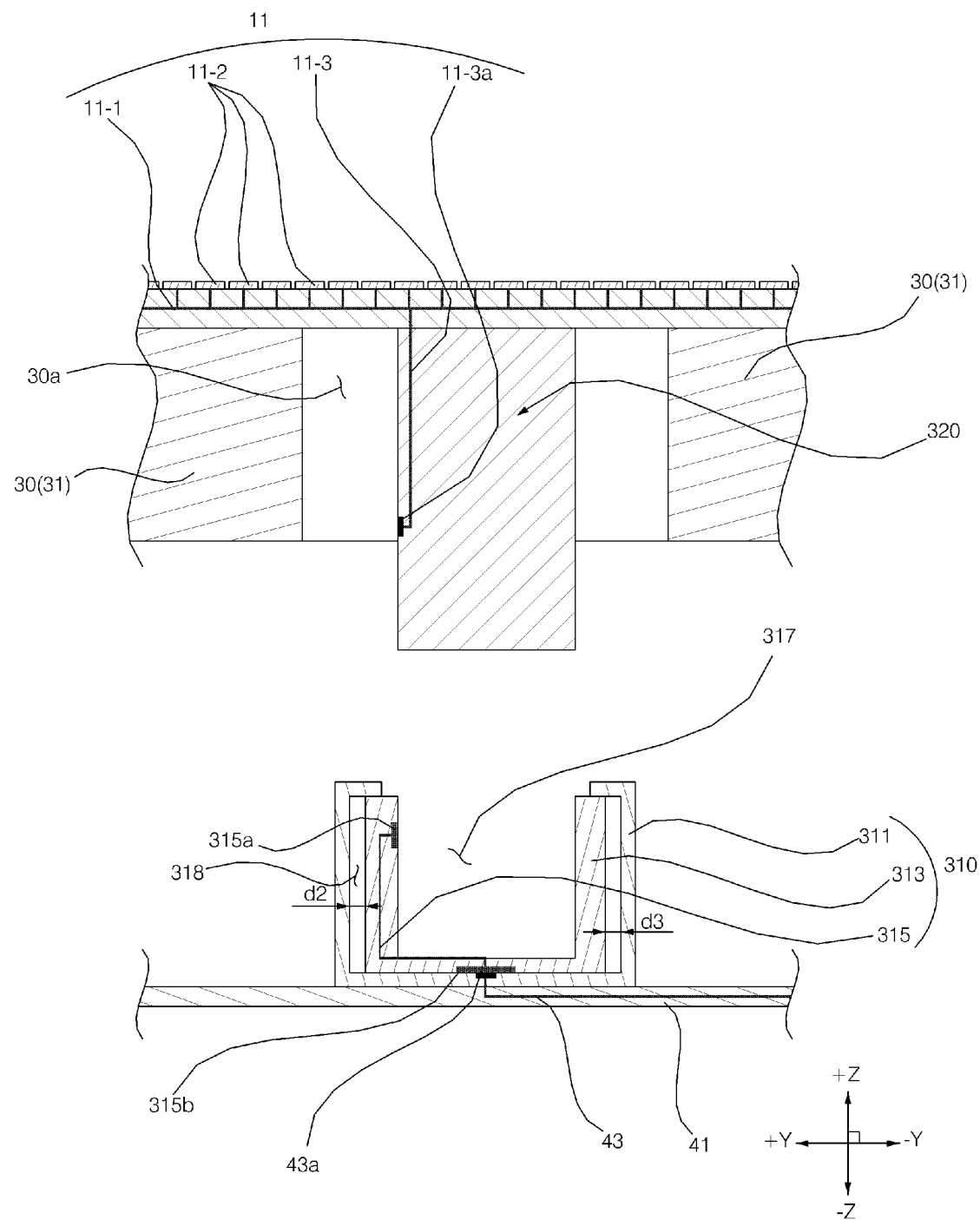

[FIG. 16A]
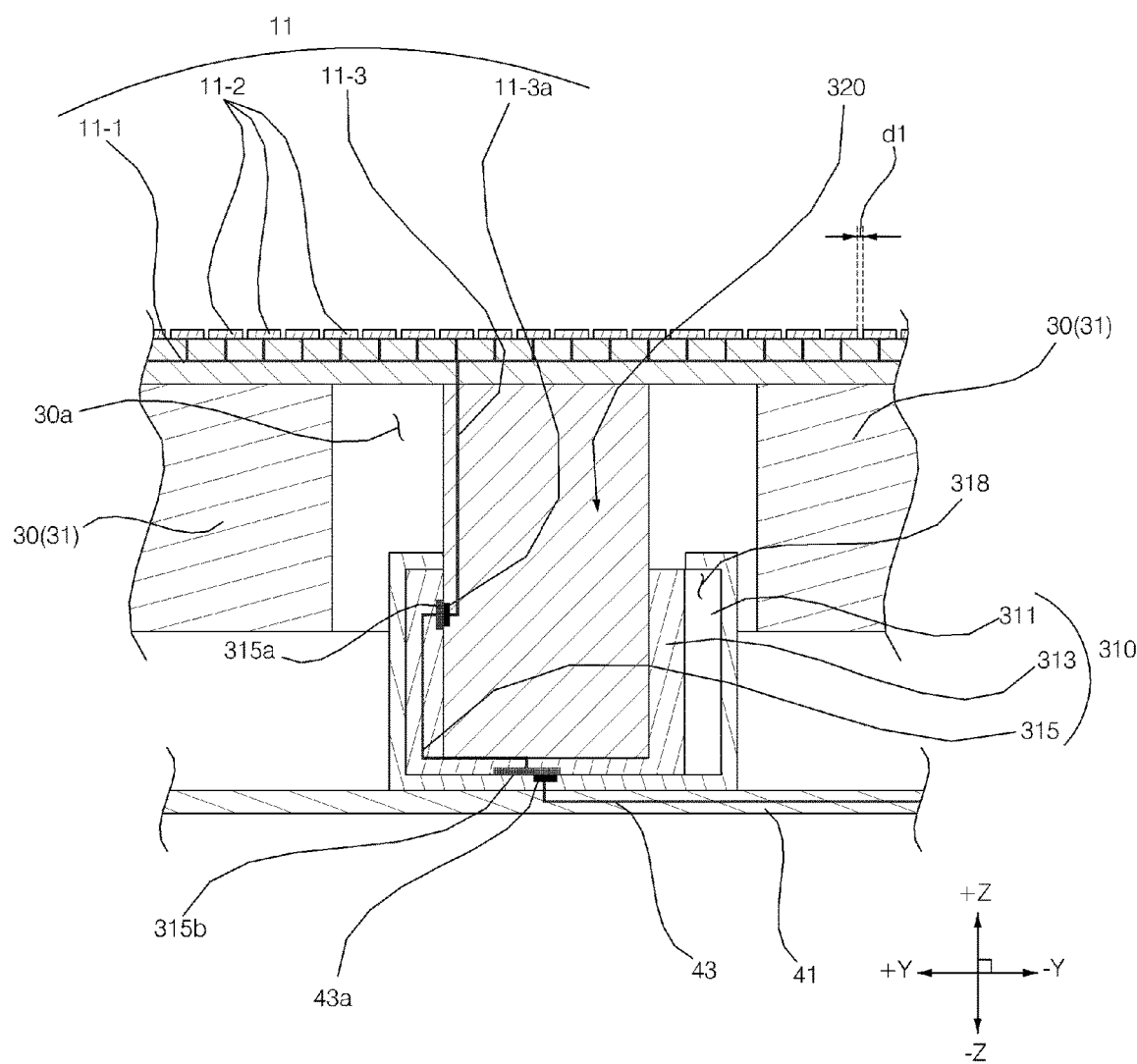

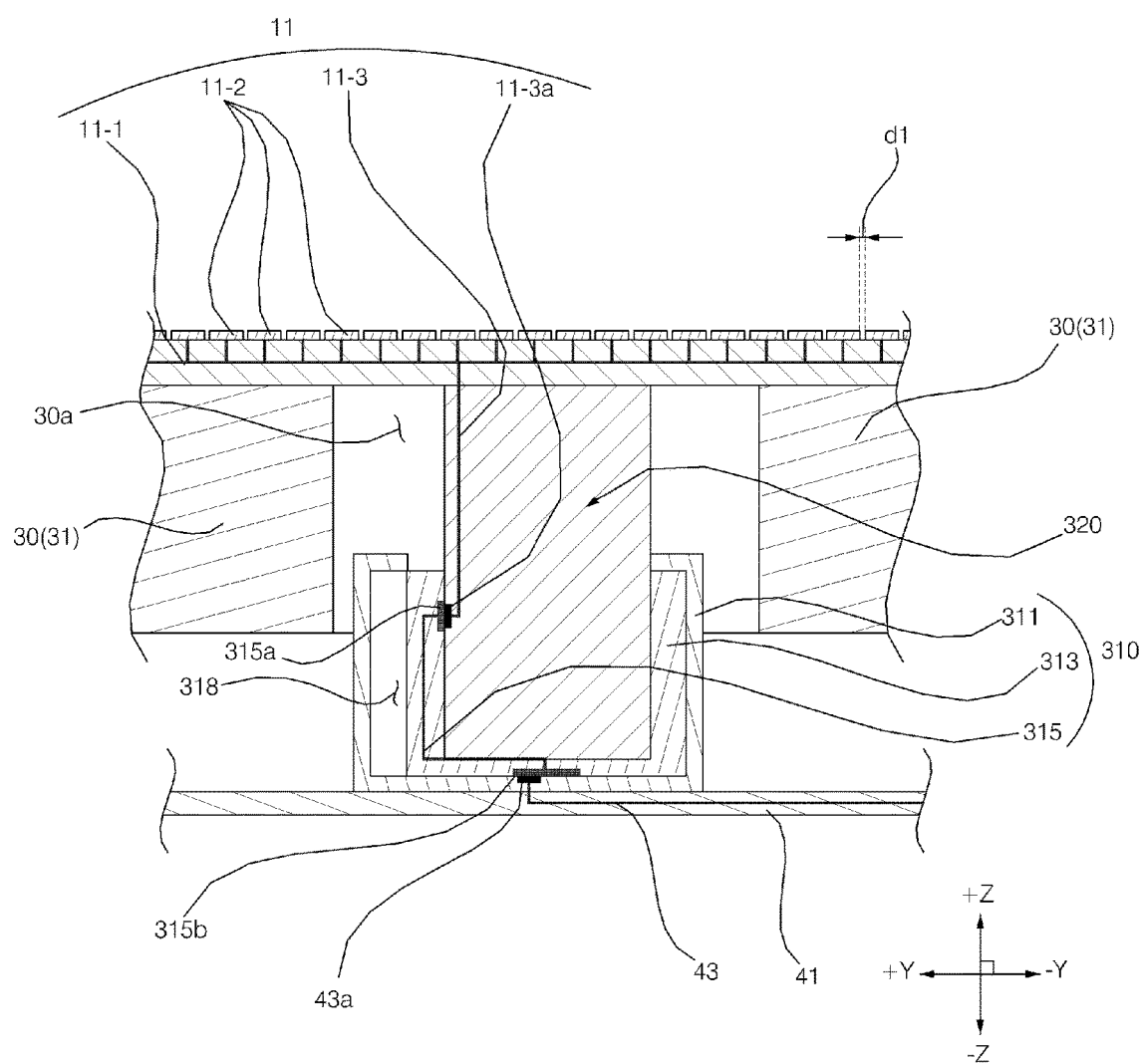
[FIG. 16B]

DISPLAY APPARATUS

CROSS-REFERENCE TO RELATED APPLICATION

Pursuant to 35 U.S.C. § 119(a), this application claims the benefit of earlier filing date and right of priority to Korean Patent Application Nos. 10-2016-0142223, filed Oct. 28, 2016 and 10-2016-0167364, filed on Dec. 9, 2016, the contents of which are all hereby incorporated by reference herein in their entirety.

BACKGROUND OF THE INVENTION

1. Field of the Invention

The present invention relates to a display apparatus, and more particularly to fine adjustment of a display module or a display panel.

2. Description of the Related Art

There are various kinds of display panels that realize images. For example, a liquid crystal display panel, a light emitting diode (LED) display panel, a plasma display pane, and an organic light emitting display panel are used.

A conventional display module includes a single display panel, which is constituted by a plurality of panel modules fixedly arranged, wherein an image is output through the single display panel. Another conventional display module includes a plurality of display panels connected to each other in order to output an image having a size larger than that of the image output through the single display panel.

In this case, it is necessary to accurately adjust the distance between the panel modules such that the panel modules can accurately output the image. In addition, it is necessary to accurately adjust the distance between the display panels such that the display panels can accurately output the image.

The conventional display panel may have a non-image part, from which no image is output, disposed at an edge part thereof. However, the LED display panel may not have the non-image part. In addition, the panel module may be an LED display panel having a front area smaller than that of the display panel, and the panel module may not have the non-image part.

For the display panel not having the non-image part, it is more important to enable fine adjustment of the distance between the display panels. In addition, for the panel module not having the non-image part, it is further important to enable fine adjustment of the distance between the panel modules. For example, a line having visually low luminance appears when the distance between adjacent LEDs is increased depending on the distance between the LED display panels and/or the distance between the panel modules. On the other hand, a line having visually high luminance appears when the distance between adjacent LEDs is decreased.

In the conventional display module, a control unit for controlling the output of images is provided on the display panel, and the control unit is electrically connected to the panel modules, which constitute the display panel, via circuits. When the panel modules are assembled to manufacture the display module, the control unit is electrically connected to the panel modules using flexible cables in order to adjust the distance between the panel modules.

SUMMARY OF THE INVENTION

In the conventional art, in the case in which an image having a larger size is provided using a plurality of display modules or a plurality of panel modules, it is difficult to uniformly adjust the distance between the display modules or between the panel modules. It is a first object of the present invention to enable fine adjustment of the distance between the display modules or between the panel modules, thereby solving the above problem.

In the conventional art, it is difficult to enable fine adjustment of the distance between display modules in the state in which the display modules are connected to each other. It is a second object of the present invention to enable fine adjustment of the distance between the display modules even in the state in which the display modules are connected to each other, thereby solving the above problem.

In the conventional art, it is difficult to adjust the distance between LEDs at various points at the interface between two display modules that are connected to each other when the distance between the LEDs is not uniform. It is a third object of the present invention to solve the above problem.

It is a fourth object of the present invention to fasten a plurality of display modules and to enable fine adjustment of the distance between the display modules without using additional fastening members.

It is a fifth object of the present invention to provide a protruding structure (e.g. a connection unit) for interconnecting two display modules, wherein the protruding structure is configured to be prevented from protruding in the state in which the display modules are not connected to each other.

In the conventional art, it is difficult to enable fine adjustment of the distance between the panel modules in the state in which they are connected to each other when the panel modules are connected to the control unit via circuits while the panel modules are coupled to the control unit so as to be supported by the control unit. It is a sixth object of the present invention to solve the above problem.

In the conventional art, it is necessary to arrange the panel modules and to enable fine adjustment of the distance between the panel modules all at the same time in order to arrange the panel modules at uniform intervals (for example, in the case in which a flexible cable is used), whereby the accuracy in adjustment of the distance between the panel modules is reduced, and assembly is not easily achieved. It is a seventh object of the present invention to enable fine adjustment of the distance between the panel modules in the state in which the panel modules are positioned, thereby solving the above problem.

In accordance with an aspect of the present invention, the above and other objects can be accomplished by the provision of a display apparatus including a display panel, a support frame disposed at a rear of the display panel and configured to support the display panel, a connection unit disposed at a first side of the support frame in a first direction and configured to protrude in the first direction, a receiving unit disposed at a second side of the support frame in a second direction opposite the first direction and shaped to comprise a receiving hole depressed in the first direction, and an adjustment unit configured to be inserted into the receiving unit in a third direction perpendicular to the first direction. On an assumption that the connection unit is inserted into the receiving hole, the adjustment unit is configured to cause the connection unit inserted in the receiving hole to move along the receiving hole as the adjustment unit moves in the third direction in a state of being in contact with the connection unit.

The display apparatus further may comprise a plurality of connection units arranged along the first side of the support frame, and a plurality of receiving units arranged along the second side of the support frame and disposed at positions along the second side corresponding to positions of the plurality of connection units on the first side.

The adjustment unit may comprise a first inclined surface that faces a direction between a direction in which the adjustment unit is inserted and the first direction. And, the connection unit may comprise a corresponding second inclined surface configured to contact the first inclined surface on an assumption that the connection unit is inserted into the receiving hole.

The adjustment unit may comprise a tapered contact part at an end in a direction in which the adjustment unit is inserted. And, the connection unit may comprise an inclined surface that slides relative to the contact part as the adjustment unit moves in the third direction on an assumption that the connection unit is inserted into the receiving hole.

The connection unit may comprise an adjustment correspondence part configured to contact the contact part on an assumption that the connection unit is inserted into the receiving hole. The adjustment correspondence part may comprise a first inclined surface and an opposite second inclined surface at a recessed portion of a side of the connection unit.

The display apparatus may further comprise a guide unit configured to guide movement of the connection unit in the first and second direction.

The display apparatus may further comprise a catching unit disposed perpendicular to the first direction and configured to fix a position of the connection unit with respect to the guide unit.

The connection unit may comprise a main groove extending in the first and second direction configured to guide the catching unit.

The connection unit may comprise a first catching recess configured to engage with the catching unit such that the connection unit is fixed at a first position with respect to the guide unit, and a second catching recess configured to engage with the catching unit such that the connection unit is fixed at a second position with respect to the guide unit. The connection unit protrudes further in the first direction from the guide unit at the first position than at the second position.

The catching unit may comprise a catching body supported by the guide unit, a catching end part configured to contact the connection unit, and an elastic member configured to bias the catching end part away from the catching body.

In accordance with another aspect of the present invention, there is provided a display apparatus including two display modules each comprising a display panel and a support frame disposed at a rear of the corresponding display panel for supporting the display panel. A first display module of the two display modules comprises a connection unit disposed at a first side of a first support frame of the first display module in a first direction and configured to protrude in the first direction. A second display module of the two display modules comprises a receiving unit disposed at a second side of a second support frame of the second display module in a second direction opposite the first direction and shaped to comprise a receiving hole configured to receive the connection unit in the first direction. The second display module further comprises an adjustment unit configured to be inserted into the receiving unit in a third direction perpendicular to the first direction. The adjustment unit is configured to cause the connection unit to move along the receiving hole as the adjustment unit moves in the third direction in a state of being in contact with the connection unit.

In accordance with another aspect of the present invention, there is provided a display apparatus including a display panel comprising a first panel module and an adjacent a second panel module arranged in an imaginary vertical plane, a control unit disposed at a rear of the display panel and configured to control the display panel to display information, a first recess part fixed to one of the control unit or the first panel module, and a first protrusion part fixed to the other of the control unit or the first panel module. The first protrusion part is configured to be inserted into the first recess part to electrically couple the control unit and the first panel module. The first recess part is configured to allow movement of the first panel module relative to the control unit in the vertical plane while the first protrusion part is inserted into the first recess part.

In order to more efficiently adjust the distance between the first panel module and the second panel module, the display apparatus may include a second recess part fixed to one of the control unit or the second panel module, and a second protrusion part fixed to the other of the control unit or the second panel module. The second protrusion part may be configured to be inserted into the second recess part to electrically couple the control unit and the second panel module. The second recess part may be configured to allow movement of the second panel module relative to the control unit in the vertical plane while the second protrusion part is inserted into the second recess part.

The first protrusion part may protrude from a rear surface of the first panel module. The second protrusion part may protrude from a rear surface of the second panel module. The first recess part and the second recess part may be disposed at a front surface of the control unit.

The display apparatus may comprise a support frame disposed at a rear of the display panel and configured to support the display panel. The support frame may comprise an opening in which at least the first recess part or the first protrusion part is disposed.

The first recess part may be further configured to allow movement of the first panel module in a first direction in which the first panel module and the second panel module are arranged.

The first recess part may be further configured to allow movement of the first panel module in a second direction perpendicular to the first direction.

The display panel may further comprise a third panel module arranged with respect to the first panel module in the second direction in the vertical plane.

The first panel module may comprise a first display board and a first plurality of light emitting diodes (LEDs) arranged at a front surface of the first display board. The second panel module may comprise a second display board and a second plurality of LEDs arranged at a front surface of the second display board. The first plurality of LEDs may be spaced apart from each other by a predetermined distance in a first direction in which the first panel module and the second panel module are arranged. The second plurality of LEDs may be spaced apart from each other by the predetermined distance in the first direction. And, the first recess part may be further configured to allow movement of the first panel module in the first direction greater than the predetermined distance.

The first recess part may comprise a moving part comprising an insertion space configured to accommodate the first protrusion part, and a recess part cabinet configured to accommodate the moving part and allow movement of the moving part in the vertical plane.

In accordance with a further aspect of the present invention, there is provided a display apparatus including a display panel including a plurality of panel modules arranged in a vertical plane for outputting images forward, a control unit disposed at the rear of the display panel for controlling the outputting the images from the display panel, a plurality of protrusion parts protruding rearward from the panel modules, and a plurality of recess parts fixed to the control unit, the protrusion parts being inserted into the recess parts to interconnect the control unit and the panel modules via circuits. The recess parts may be configured such that the panel modules are movable in the vertical plane in the state in which the protrusion parts are inserted into the recess parts.

BRIEF DESCRIPTION OF THE DRAWINGS

The accompanying drawings, which are included to provide a further understanding of the invention and which are incorporated in and constitute a part of this application, illustrate embodiments of the invention and together with the description serve to explain the principle of the invention. In the drawings:

FIG. 1 is a perspective view showing a display apparatus according to an embodiment of the present invention with enlarged views showing a first fixing unit and a second fixing unit;

FIG. 2 is an elevation view showing the rear surface of the display apparatus of FIG. 1;

FIG. 3 is a sectional conceptual view taken along line S1-S1' of FIG. 2;

FIG. 4 is a rear elevation view showing the state in which a plurality of display modules is coupled to each other with an enlarged view showing the coupling between the first fixing unit and the second fixing unit;

FIG. 5 is an enlarged perspective view showing the first fixing unit and the second fixing unit of FIG. 4;

FIGS. 6 to 8 are sectional views taken along line S2-S2' of FIG. 5, wherein FIG. 6 is a sectional view showing the direction in which a connection unit is moved in response to the insertion of an adjustment unit, FIG. 7 is a sectional view showing the direction in which the connection unit is moved in response to the withdrawal of the adjustment unit, and FIG. 8 is a sectional view showing the state in which the first fixing unit and the second fixing unit are not coupled to each other, and wherein FIGS. 6 and 7 show the state in which a catching unit is inserted into a first catching recess to fix the connection unit, and FIG. 8 shows the state in which the catching unit is inserted into a second catching recess to fix the connection unit;

FIGS. 9A and 9B are perspective views showing the connection unit of FIGS. 6 to 8, wherein FIG. 9A is a perspective view showing the connection unit when viewed at an angle at which an adjustment correspondence part is visible, and FIG. 9B is a perspective view showing the connection unit when viewed at an angle at which a main groove is visible;

FIG. 10 is an elevation view showing the adjustment unit of FIGS. 6 to 8;

FIGS. 11A and 11B are an elevation view showing the front surface of the display apparatus of FIG. 1 and a partially enlarged view of the elevation view, wherein FIG. 11A is a view showing a state before the arrangement of a plurality of panel modules is finely adjusted, and FIG. 11B is a view showing a state after the arrangement of the panel modules is finely adjusted;

FIGS. 12A and 12B are perspective views showing the panel modules and a control board of the display apparatus of FIG. 1, wherein FIG. 12A is a view showing a state before recess parts and protrusion parts are coupled to each other, and FIG. 12B is a view showing a state after the recess parts and the protrusion parts are coupled to each other;

FIG. 13 is a partial perspective view showing the state in which the recess parts and the protrusion parts of FIG. 12B are coupled to each other;

FIG. 14 is a sectional conceptual view taken along line S3-S3' of FIG. 13;

FIG. 15 is a sectional conceptual view showing the state in which the recess parts and the protrusion parts of FIG. 14 are separated from each other; and FIGS. 16A and 16B are sectional conceptual views showing the movement of the panel module within a movable range in the state in which the recess parts and the protrusion parts of FIG. 13 are coupled to each other, wherein FIG. 16A is a view showing the state in which the panel module is moved to one side with respect to the control board, and FIG. 16B is a view showing the state in which the panel module is moved to the other side with respect to the control board.

DETAILED DESCRIPTION OF THE PREFERRED EMBODIMENTS

Exemplary embodiments of the present invention will be described with reference to the attached drawings.

The present invention will be described based on a spatial rectangular coordinate system defined by an X axis, a Y axis, and a Z axis, which are perpendicular to each other, with reference to FIG. 1. Each axis direction (i.e. an X-axis direction, a Y-axis direction, or a Z-axis direction) means both of the directions in which the corresponding axis extends. Each positive axis direction (i.e. a positive X-axis direction, a positive Y-axis direction, or a positive Z-axis direction) means a positive direction, which is one of the two directions in which the axis extends. Each negative axis direction (i.e. a negative X-axis direction, a negative Y-axis direction, or a negative Z-axis direction) means a negative direction, which is the other of the two directions in which the axis extends. However, these definitions are given only for clear understanding of the present invention, and the directions may be defined differently depending on the circumstances.

In the following description, the terms "forward" and "rearward" are defined on the assumption that the surface of a display panel 10 from which an image is output is directed forward. That is, the positive Z-axis direction is defined as the forward direction, and the negative Z-axis direction is defined as the rearward direction. However, these definitions are given only for clear understanding of the present invention, and the directions may be defined differently depending on the circumstances.

In the following description, the terms "first," "second," and "third" are used only to avoid confusion between designated components, and do not indicate the sequence or importance of the components or the relationships between the components. For example, a display apparatus 1 may include only a second component, and may lack a first component.

The "first direction" means one selected from between the positive X-axis direction and the positive Y-axis direction of FIG. 1. When the first direction is the positive X-axis direction, the "second direction" means the negative X-axis direction. When the first direction is the positive Y-axis direction, the "second direction" means the negative Y-axis direction. The expression "first and second directions" means both directions.

The "third direction" means the direction perpendicular to the first and second directions. The third direction is any one of various directions perpendicular to the first and second directions. When the first direction is the positive X-axis direction, the third direction may be the Y-axis direction, the Z-axis direction, or a specific direction between the Y-axis direction and the Z-axis direction. When the first direction is the positive Y-axis direction, the third direction may be the X-axis direction, the Z-axis direction or a specific direction between the X-axis direction and the Z-axis direction.

The "fourth direction" means the direction perpendicular to the first and second directions. The fourth direction is any one of various directions perpendicular to the first and second directions. When the first direction is the positive X-axis direction, the fourth direction may be the Y-axis direction, the Z-axis direction, or a specific direction between the Y-axis direction and the Z-axis direction. When the first direction is the positive Y-axis direction, the fourth direction may be the X-axis direction, the Z-axis direction or a specific direction between the X-axis direction and the Z-axis direction. The fourth direction may be identical to or different from the third direction.

The minimum unit of a display apparatus 1 according to this embodiment that is capable of constituting a finished product may be referred to as a display module 1. The display apparatus 1 may include at least one display module 1. The display apparatus 1 shown in FIG. 1 is a single display module 1.

The display apparatus 1 according to this embodiment may include a plurality of display modules 1a, 1b, 1c, .... A display apparatus 1 shown in FIG. 4 includes a plurality of display modules 1a, 1b, 1c, and 1d, which are coupled to each other. One of two adjacent display modules, a description of which is given, may be referred to as a "concerned module," and the other may be referred to as an "adjacent module."

In the display module 1 according to this embodiment, a first fixing unit 100 and a second fixing unit 200 are disposed at opposite ends(sides) in the X-axis direction, and a first fixing unit 100 and a second fixing unit 200 are disposed at opposite ends(sides) in the Y-axis direction (see FIG. 1). Alternatively, the first fixing unit 100 and a second fixing unit 200 may be disposed only at opposite ends(sides) in the X-axis direction, or the first fixing unit 100 and a second fixing unit 200 may be disposed only at opposite ends(sides) in the Y-axis direction.

In the display module 1 according to this embodiment, a plurality of first fixing units 100a and 100b is disposed at one end(a first side) of a support frame 30 so as to be spaced apart from each other, and a plurality of second fixing units 200a and 200b is disposed at the other end(a second side) of the support frame 30 so as to be spaced apart from each other (see FIG. 1). Alternatively, only one first fixing unit 100 may be disposed at one end(a first side) of the support frame 30, and only one second fixing unit 200 may be disposed at the other end(a second side) of the support frame 30.

In the following description, the term "X-axis" or "Y-axis" may be attached to components in order to distinguish between the components. An "X-axis component" means a component disposed at one of the opposite ends(the opposite sides) of the support frame 30 in the X-axis direction, and a "Y-axis component" means a component disposed at one of the opposite ends(the opposite sides) of the support frame 30 in the Y-axis direction.

Referring to FIGS. 1 to 3, a display module 1 according to an embodiment of the present invention includes a display panel 10 for displaying an image. The display panel 10 outputs an image forward. In one example, the display panel 10 may be a light emitting diode (LED) display panel. In another example, the display panel 10 may be a thin film transistor liquid crystal display (LCD) panel. In a further example, the display panel 10 may be any one selected from among a plasma display panel (PDP), a field emission display (FED) panel, and an organic light emitting display (OLED) panel. Hereinafter, the display panel 10 will be described as an LED display panel. However, the present invention is not limited thereto.

Referring to FIGS. 1 to 3, 11a and 11b, the LED display panel 10 may include a plurality of LEDs 11-2 arranged at predetermined intervals along an X axis and a Y axis. The LEDs 11-2 emit light forward. The LED display panel 10 may include a display board 11-1 on which the LEDs 11-2 are disposed. The display board 11-1 defines the thickness of the LED display panel 10 in the forward-rearward direction.

Referring to FIGS. 1 to 3, 11a and 11b, the display panel 10 may include a plurality of panel modules 11 for outputting images forward. The panel modules 11 are arranged in a vertical plane (i.e. a plane parallel to both the X axis and the Y axis). When viewed from the front, the panel modules 11 are disposed so as to partition the vertical plane. For example, each of the panel modules 11 may be an LED display panel having a front area less than that of the display panel 10.

Referring to FIGS. 1 to 3, the display module 1 includes a support frame 30 disposed at the rear of the display panel 10. The support frame 30 is disposed in the negative Z-axis direction of the display panel 10. The support frame 30 supports the display panel 10. The display panel 10 may be coupled to the support frame 30 using an adhesive member (e.g. an adhesive material) or a fastening member (e.g. a screw). The support frame 30 may absorb heat from the display panel 10, and may dissipate the absorbed heat. The support frame 30 may be provided with a opening 30a, through which a circuit connection unit 300 extends.

Referring to FIGS. 1 to 3, 12a and 12b, the display module 1 includes a control unit 40 for controlling the output of an image. The control unit 40 is supported by the support frame 30. The control unit 40 is disposed at the rear of the support frame 30. The control unit 40 may be fixed to the support frame 30. The control unit 40 may include a speaker (not shown), and may control an acoustic signal. The control unit 40 may control the application of power to the display panel 10 or the speaker. The control unit 40 may include an input unit (not shown) for allowing a user to manipulate the display apparatus. The control unit 40 may include a control board 41 provided to realize the above function. The control board 41 may be a printed circuit board (PCB). The control board 41 may be disposed at the front of the control unit 40. Various electrical devices may be disposed on the control board 41. Recess parts 310 or protrusion parts 320, a description of which will follow, are fixed to the control board 41. The control unit 40 may include a connection terminal, to which various lines are connected.

Referring to FIGS. 1 to 3, the display module 1 includes a rear case 50, which defines at least a portion of the rear surface of the display apparatus. The rear case 50 may be fixed to a main frame 30. The rear case 50 covers the control unit 40 of the main frame 30. The control unit 40 is received in the rear case 50.

Referring to FIGS. 1 to 3, the support frame 30 includes a panel support unit 31 for supporting the display panel 10. The panel support unit 31 may have a quadrangular shape when viewed from the rear. The panel support unit 31 may have a plate shape having a predetermined thickness in the forward-rearward direction. The panel support unit 31 may have an area corresponding to that of the display panel 10. The display panel 10 may be coupled to the front surface of the panel support unit 31.

Referring to FIGS. 1 to 3, the support frame 30 includes an edge unit 32 disposed along the edge of the support frame 30. The edge unit 32 may extend along the edge of the support frame 30 while protruding rearward from the panel support unit 31. The edge unit 32 may have a rib shape. The edge unit 32 includes X-axis edge units 32a and 32b disposed at opposite ends of the support frame 30 in the X-axis direction. The edge unit 32 includes Y-axis edge units 32c and 32d disposed at opposite ends of the support frame 30 in the Y-axis direction.

Referring to FIGS. 1 to 3, the support frame 30 includes a heat dissipation unit 33 protruding rearward from the rear surface of the panel support unit 31. The heat dissipation unit 33 includes a plurality of heat dissipation fins extending in the Y-axis direction. The heat dissipation fins are arranged at intervals in the X-axis direction.

Referring to FIGS. 1 to 3, the support frame 30 may include an auxiliary frame 37 for supporting the control unit 40 or the rear case 50. The auxiliary frame 37 is disposed at the rear of the panel support unit 31. The auxiliary frame 37 may be fixed by a fastening member fastened through a fastening support structure, protruding rearward from the panel support unit 31, from the rear in the state in which the front surface of the auxiliary frame 37 is in contact with the fastening support structure.

Referring to FIGS. 1 to 3, the display module 1 includes a first fixing unit 100 disposed at the end of the support frame 30 in the first direction. The display module 1 includes a second fixing unit 200 disposed at the end of the support frame 30 in the second direction.

Referring to FIGS. 1 to 3, the first fixing unit 100 and the second fixing unit 200 correspond to each other. Specifically, when two display modules 1a and 1b having the same shape are coupled to each other, the first fixing unit 100 of the display module 1a is connected to the second fixing unit 200 of the display module 1b. That the first fixing unit 100 and the second fixing unit 200 correspond to each other means that, on the assumption that a plurality of display modules 1 having the same shape is disposed, the first fixing unit 100 and the second fixing unit 200 are connected to each other.

Referring to FIGS. 1 to 3, first fixing units 100a and 100b may be disposed at the end of the support frame 30 in the positive X-axis direction. Pluralities of first fixing units 100a and 100b may be disposed at the end of the support frame 30 in the positive X-axis direction, and may be arranged at intervals in the Y-axis direction.

Referring to FIGS. 1 to 3, first fixing units 100c and 100d may be disposed at the end of the support frame 30 in the positive Y-axis direction. Pluralities of first fixing units 100c and 100d may be disposed at the end of the support frame 30 in the positive Y-axis direction, and may be arranged at intervals in the X-axis direction.

Referring to FIGS. 1 to 3, second fixing units 200a and 200b may be disposed at the end of the support frame 30 in the negative X-axis direction. Pluralities of second fixing units 200a and 200b may be disposed at the end of the support frame 30 in the negative X-axis direction, and may be arranged at intervals in the Y-axis direction.

Referring to FIGS. 1 to 3, second fixing units 200c and 200d may be disposed at the end of the support frame 30 in the negative Y-axis direction. Pluralities of second fixing units 200c and 200d may be disposed at the end of the support frame 30 in the negative Y-axis direction, and may be arranged at intervals in the X-axis direction.

Referring to FIGS. 1 to 3, the first fixing units 100a and 100b correspond to the second fixing units 200a and 200b, respectively. The first fixing units 100c and 100d correspond to the second fixing units 200c and 200d, respectively.

Hereinafter, one of the first fixing units 100a, 100b, 100c, and 100d, e.g. the first fixing unit 100, and the second fixing part 200 corresponding thereto will be described. The following description may be equally applied to the other first and second fixing units.

Referring to FIGS. 4 to 8, The first fixing unit 100 includes a connection unit 130 disposed at the end(the first side) of the support frame 30 in the first direction. The connection unit 130 is configured to protrude outward. in the first direction. The connection unit 130 protrudes in the first direction. The first fixing unit 100 includes a guide unit 110 for guiding the movement of the connection unit 130 in the first and second directions. The connection unit 130 includes a catching unit 150 for fixing the connection unit 130 at a specific position.

Referring to FIGS. 4 to 8, The second fixing unit 200 of the concerned module 1 includes a receiving unit 210 for receiving the protruding end of the connection unit 130 of the adjacent module 1. The receiving unit 210 of the concerned module 1 has a receiving hole 210a, into which the connection unit 130 of the adjacent module 1 is inserted. The second fixing unit 200 of the concerned module 1 includes an adjustment unit 240 configured to move in the third direction in the state of being in contact with the connection unit 130 of the adjacent module 1. The adjustment unit 240 enables the connection unit 130 to move in the first direction in the state of being coupled into the receiving unit 210. The connection unit 130 of the adjacent module 1 is moved in one of the first and second directions by the adjustment unit 240 of the concerned module 1, whereby the distance between the concerned module 1 and the adjacent module 1 may be finely adjusted.

The connection unit 130 of the concerned module 1 is disposed at the end(the first side) in the first direction, and the receiving hole 210a of the concerned module 1 is disposed at the end(the second side) in the second direction. Consequently, the connection unit 130 of the concerned module 1 cannot be inserted into the receiving hole 210a of the concerned module 1. In order to described the constructions of the first fixing unit 100 and the second fixing unit 200 of the concerned module 1, however, it may be assumed that the connection unit 130 of the concerned module 1 is inserted into the receiving hole 210a of the concerned module 1. The operational relationship between the first fixing unit 100 and the second fixing unit 200 under this assumption is identical to the operational relationship between the first fixing unit 100 of the adjacent module 1 and the second fixing unit 200 of the concerned module 1 in the state in which the connection unit 130 of the adjacent module 1 is inserted into the receiving hole 210a of the concerned module 1. The reason that this assumption is needed is because display modules 1 having the same shape are disposed and connected to each other, although the present invention can be realized as a single display module 1. In the following description, it is assumed that the connection unit 130 is inserted into the receiving hole 210*a*.

Referring to FIGS. 5 to 9B, the connection unit 130 is disposed at the end of the support frame 30 in the first direction. The connection unit 130 protrudes in the first direction. A plurality of connection units 130 may be arranged along the end of the support frame 30 in the first direction. The connection units 130 may be arranged at intervals. The connection units 130 may be arranged parallel to each other.

Referring to FIGS. 5 to 9B, the connection unit 130 is movable in the first and second directions. The connection unit 130 is movable relative to the guide unit 110 in the first and second directions. The connection unit 130 is movable in the first and second directions in the state of being inserted into a guide hole 110*a*. The connection unit 130 can be inserted into the receiving hole 210*a* of the adjacent module 1.

Referring to FIGS. 5 to 9B, the connection unit 130 includes a connection body 133 extending in the first and second directions. The connection body 133 may be formed in a cylindrical shape having a central axis in the first and second directions. A head part 135, a description of which will follow, is disposed at the end of the connection body 133 in the second direction. An insertion end part 131, a description of which will follow, is disposed at the end of the connection body 133 in the first direction.

Referring to FIGS. 5 to 9B, the connection unit 130 includes an insertion end part 131, which defines the end of the connection unit 130 in the direction in which the connection unit 130 is inserted. The insertion end part 131 defines the end of the connection unit 130 in the first direction. The insertion end part 131 is the part that is inserted into the receiving hole 210*a* first. The insertion end part 131 includes a portion that gradually becomes thin in the first direction. That is, the insertion end part 131 is tapered.

Referring to FIGS. 5 to 9B, the connection unit 130 includes a head part 135, which defines the opposite end of the connection unit 130 in the direction in which the connection unit 130 is inserted. The head part 135 defines the end of the connection unit 130 in the second direction. The head part 135 may prevent the connection unit 130 from being separated from the guide unit 110 in the first direction. The head part 135 has a section greater than that of the connection body 133. The head part 135 includes a portion that is stepped in the direction away from the central axis of the connection body 133. The head part 135 may not be inserted into the guide hole 110*a*, but may be caught by the guide unit 110.

Referring to FIGS. 5 to 9B, the connection unit 130 includes an adjustment correspondence part 137, which contacts the adjustment unit 240. The adjustment correspondence part 137 may be formed in the connection body 133. The adjustment correspondence part 137 may be formed by recessing the surface of the connection body 133 in the direction perpendicular to the first and second directions. The adjustment correspondence part 137 may be formed by recessing the surface of the connection body 133 in the third direction. The adjustment correspondence part 137 may include an inclined surface. The adjustment correspondence part 137 slides together with a contact part 241 of the adjustment unit 240 in response to the movement of the adjustment unit 240, whereby the connection unit 130 moves, a detailed description of which will follow.

Referring to FIGS. 5 to 9B, the connection unit 130 includes a main groove 130*a* extending in the first and second directions. The main groove 130*a* may be formed by recessing the surface of the connection body 133. The main groove 130*a* may be formed by recessing the surface of the connection body 133 in the direction perpendicular to the first and second directions. The main groove 130*a* may be formed by recessing the surface of the connection body 133 in the fourth direction. The main groove 130*a* guides the movement of the catching unit 150 relative to the connection unit 130. A catching end part 151 may be inserted into the main groove 130*a* so as to perform the relative movement thereof in the direction in which the main groove 130*a* extends. The catching end part 151 may be inserted into the main groove 130*a* so as to contact the connection body 133. The catching end part 151 may be inserted into the main groove 130*a* so as to slide relative to the connection body 133.

Referring to FIGS. 5 to 9B, the connection unit 130 may include catching recesses 130*c* and 130*b*, into which the catching unit 150 is inserted such that the connection unit 130 can be fixed at a specific position. The specific position may include a position in the state in which the connection unit 130 protrudes in the first direction, i.e. a first position. The specific position may include a position in the state in which the connection unit 130 is inserted in the second direction, i.e. a second position.

Referring to FIGS. 5 to 9B, the connection unit 130 includes a first catching recess 130*c*, into which the catching unit 150 is inserted such that the connection unit 130 can be fixed at the first position, at which the connection unit 130 protrudes in the first direction. The connection unit 130 includes a second catching recess 130*b*, into which the catching unit 150 is inserted such that the connection unit 130 can be fixed at the second position, at which the connection unit 130 protrudes less in the first direction than at the first position. The catching end part 151 may be inserted into the first catching recess 130*c*. The catching end part 151 may be inserted into the second catching recess 130*b*.

Referring to FIGS. 5 to 9B, the first catching recess 130*c* is formed by recessing the surface of the connection body 133 in the direction perpendicular to the first and second directions. The first catching recess 130*c* is formed by recessing the surface of the connection body 133 in the fourth direction. The first catching recess 130*c* may be circular. The first catching recess 130*c* may be hemispherical.

Referring to FIGS. 5 to 9B, the second catching recess 130*b* is formed by recessing the surface of the connection body 133 in the direction perpendicular to the first and second directions. The second catching recess 130*b* is formed by recessing the surface of the connection body 133 in the fourth direction. The second catching recess 130*b* may be circular. The second catching recess 130*b* may be hemispherical.

Referring to FIGS. 5 to 9B, the first catching recess 130*c* and the second catching recess 130*b* are spaced apart from each other in the first and second directions. The first catching recess 130*c* is disposed so as to be closer to the second direction than the second catching recess 130*b*.

Referring to FIGS. 5 to 9B, the first catching recess 130*c* may be formed by further recessing the surface of the connection body 133 in which the main groove 130*a* is formed. The first catching recess 130*c* is formed more deeply in the fourth direction than the main groove 130*a*.

Referring to FIGS. 5 to 9B, the second catching recess 130*b* may be formed by further recessing the surface of the connection body 133 in which the main groove 130*a* is formed. The second catching recess 130b is formed more deeply in the fourth direction than the main groove 130a.

Referring to FIGS. 5 to 8, the guide unit 110 guides the movement of the connection unit 130 in the first and second directions. The guide unit 110 is fixed to the support frame 30. The guide unit 110 includes a guide hole 110a extending in the first and second directions. A portion of the connection body 133 is inserted into the guide hole 110a. The connection unit 130 is inserted into the guide hole 110a so as to be movable in the first and second directions. The guide unit 110 may be provided with a fixing end, by which the head part 135 is caught. The guide unit 110 receives the load of the connection unit 130. The guide unit 110 protrudes rearward from the rear surface of the panel support unit 31. The guide unit 110 is fixed to the panel support unit 31. The guide unit 110 may be disposed at the middle of the edge unit 32.

Referring to FIGS. 6 to 8, the catching unit 150 is disposed at the guide unit 110. The catching unit 150 enables the connection unit 130 to be fixed at the specific position. The catching unit 150 enables the connection unit 130 to be fixed at the first position. The catching unit 150 enables the connection unit 130 to be fixed at the second position.

Referring to FIGS. 6 to 8, the catching unit 150 is disposed perpendicular to the first direction. The catching unit 150 may extend in the fourth direction. The catching unit 150 contacts the connection unit 130. The catching unit 150 moves relative to the connection unit 130 along the main groove 130a. The catching unit 150 is inserted into the first catching recess 130c such that the connection unit 130 is fixed. The catching unit 150 is inserted into the second catching recess 130b such that the connection unit 130 is fixed.

Referring to FIGS. 6 to 8, the guide unit 110 includes a catching unit hole (not shown) formed from the outside to the interior of the guide hole 110a in the fourth direction. The catching unit 150 is inserted into the catching unit hole. The catching unit 150 is displaced in the fourth direction in the state of being inserted into the catching unit hole. For example, a screw groove is formed in the inner surface of the catching unit hole, and a screw having a shape that is engaged into the screw groove is formed at the outer surface of the catching unit 150. When the catching unit 150 is positioned in the catching unit hole, the catching unit 150 remains fixed to the guide unit 110.

Referring to FIGS. 6 to 8, the catching unit 150 includes a catching body 155, which is supported by the guide unit 110. The catching body 155 may extend in the fourth direction. The catching body 155 is provided on the outer surface thereof with a screw having a shape that is engaged into the screw groove of the catching unit hole. The catching body 155 may extend through the guide unit 110. The catching body 155 is provided therein with a space for receiving an elastic part 153, a description of which will follow. The space for receiving the elastic part 153 of the catching body 155 may extend in the fourth direction. The catching end part 151 is disposed in the space for receiving the elastic part 153 of the catching body 155 in the direction in which the connection unit 130 is visible.

Referring to FIGS. 6 to 8, the catching unit 150 includes a catching end part 151 disposed in the guide hole 110a in the closest direction. The catching end part 151 is formed at one end of the catching body 155. The catching end part 151 contacts the connection unit 130. One end of the catching end part 151 contacts the connection unit 130. The catching end part 151 contacts the surface of the connection body 133. The catching end part 151 may slide relative to the connection unit 130 along the main groove 130a. The catching end part 151 may be inserted into the first catching recess 130c. The catching end part 151 may be inserted into the second catching recess 130b. The catching end part 151 may be formed to have a ball shape. The catching end part 151 is supported by an elastic part 153 so as to be movable in the fourth direction.

Referring to FIGS. 6 to 8, the catching unit 150 includes an elastic part 153 for elastically support the catching end part 151. The elastic part 153 is disposed between the catching body 155 and the catching end part 151. The elastic part 153 is disposed in the catching body 155. One end of the elastic part 153 is supported by the catching body 155, and the catching end part 151 is supported by the elastic part 153 at the other end of the elastic part 153.

Referring to FIGS. 6 to 8, the catching end part 151 is finely movable in the fourth direction depending on the extent to which the surface of the connection body 133 that is in contact with the catching end part 151 is recessed or protrudes. When the catching end part 151 moves in the fourth direction, the elastic part 153 is elastically deformed and applies elastic force to the catching end part 151. The direction in which the elastic force is applied to the catching end part 151 is the direction toward the surface of the connection body 133. The catching end part 151 may be inserted into the first catching recess 130c using the elastic force. In addition, the catching end part 151 may be inserted into the second catching recess 130b using the elastic force.

Referring to FIGS. 6 to 8, the catching unit 150 includes a manipulation part 247 for manipulating the extent to which the catching unit 150 is inserted into the catching unit hole. The manipulation part 247 is formed at one end of the catching body 155. The manipulation part 247 is formed at the end of the catching body 155 in the direction away from the connection unit 130. The manipulation part 247 may be formed in a polygonal recess shape. The manipulation part 247 is formed at the end of the catching unit 150 in the direction opposite the direction in which the catching end part 151 is disposed. The user may rotate a rotation tool having a shape engaged with the manipulation part 247 in the state of inserting the rotation tool into the manipulation part 247 to manipulate the intensity of contact between the catching unit 150 and the connection unit.

Referring to FIGS. 5 to 8, The receiving unit 210 is disposed at the end of the support frame 30 in the second direction. The receiving unit 210 includes a receiving hole 210a, which is formed deeply in the first direction. A plurality of receiving units 210 may be arranged along the end of the support frame 30 in the second direction. The receiving units 210 may be arranged at intervals. The receiving units 210 are disposed so as to correspond to the connection units 130. The receiving unit 210 may protrude rearward from the rear surface of the panel support unit 31. The receiving unit 210 is fixed to the panel support unit 31. The receiving unit 210 may be disposed at the middle of the edge unit 32.

Referring to FIGS. 5 to 8, a portion of the connection body 133 can be inserted into the receiving hole 210a. The connection unit 130 of the adjacent module 1 can be inserted into the receiving hole 210a. The receiving hole 210a extends in the first and second directions. The connection unit 130 can be inserted into the receiving hole 210a. The connection unit 130 and the receiving hole 210a corresponding thereto are arranged in a line in the first and second directions. On the assumption that the connection unit 130 moves a predetermined distance parallel thereto in the second direction, the connection unit 130 can be inserted into the receiving hole 210*a*.

Referring to FIGS. 5 to 8, the adjustment unit 240 is movable in the third direction. The adjustment unit 240 can be inserted into the side of the receiving hole 210*a*. The receiving unit 210 includes an adjustment unit hole (not shown) formed from the outside to the interior of the receiving hole 210*a* in the third direction. The receiving unit 210 is inserted into the adjustment unit hole. The adjustment unit 240 is displaced in the third direction in the state of being inserted into the adjustment unit hole. For example, a screw groove is formed in the inner surface of the adjustment unit hole, and a screw 245*a* having a shape that is engaged into the screw groove is formed at the outer surface of the adjustment unit 240 (see FIG. 10). When the adjustment unit 240 is positioned in the adjustment unit hole, the adjustment unit 240 remains fixed to the receiving unit 210.

Referring to FIGS. 5 to 8, the adjustment unit 240 includes an adjustment body 245, which is supported by the receiving unit 210. The adjustment body 245 may extend in the third direction. The adjustment body 245 is provided at the outer surface thereof with a screw 245*a* having a shape that is engaged into the screw groove of the adjustment unit hole (see FIG. 10). The adjustment body 245 may extend through the receiving unit 210.

Referring to FIGS. 5 to 8, the adjustment unit 240 includes a contact part 241 disposed in the receiving hole 210*a* in the closest direction. The catching end part 151 is formed at one end of the catching body 155. The contact part 241 contacts the connection unit 130. One side of the contact part 241 may contact the connection unit 130. The contact part 241 may contact the adjustment correspondence part 137.

Referring to FIGS. 5 to 8, whether the contact part 241 contacts the adjustment correspondence part 137 may be determined depending on the extent to which the adjustment unit 240 is inserted into the adjustment unit hole. The portion of the contact part 241 that contacts the adjustment correspondence part 137 may be changed depending on the extent to which the adjustment unit 240 is inserted into the adjustment unit hole (see FIGS. 6 and 7).

Referring to FIGS. 5 to 8, the adjustment end part 151 contacts the surface of the connection body 133. The adjustment end part 151 may slide relative to the connection unit 130 along the main groove 130*a*. The adjustment end part 151 may be inserted into the first adjustment recess 130*c*. The adjustment end part 151 may be inserted into the second adjustment recess 130*b*. The adjustment end part 151 may be formed to have a ball shape. The adjustment end part 151 is supported by the elastic part 153 so as to be movable in the fourth direction.

Referring to FIGS. 5 to 8, the contact part 241 may include an inclined surface facing the direction between the direction in which the adjustment unit 240 is inserted and the first direction (i.e. an inclined surface facing an inclined surface 137*a*). The contact part 241 may include an inclined surface facing the direction between the direction in which the adjustment unit 240 is inserted and the second direction (i.e. an inclined surface facing an inclined surface 137*b*).

Referring to FIGS. 5 to 8, in the case in which the adjustment unit 240 includes a screw 245*a*, the contact part 241 may include a portion that gradually becomes thin toward the end thereof in the insertion direction. In this case, in the state in which the adjustment unit 240 is fixed to the receiving unit 210, even when the adjustment unit 240 is inserted while rotating, the contact part 241 includes both an inclined surface facing the direction between the direction in which the adjustment unit 240 is inserted and the first direction (i.e. an inclined surface facing the inclined surface 137*a*) and an inclined surface facing the direction between the direction in which the adjustment unit 240 is inserted and the second direction (i.e. an inclined surface facing the inclined surface 137*b*). Each of the inclined surfaces of the contact part 241 may have an angle of inclination of 45 degrees in the first and second directions.

Referring to FIGS. 5 to 8, the adjustment unit 240 includes a manipulation part 247 for manipulating the extent to which the adjustment unit 240 is inserted into the adjustment unit hole. The manipulation part 247 is formed at one end of the adjustment body 245. The manipulation part 247 is formed at the end of the adjustment body 245 in the direction away from the connection unit 130. The manipulation part 247 may be formed in a polygonal recess shape. The manipulation part 247 is formed at the end of the adjustment unit 240 in the direction opposite the direction in which the contact part 241 is disposed.

The user may rotate a rotation tool having a shape engaged with the manipulation part 247 in the state in which the rotation tool is inserted into the manipulation part 247 to move the adjustment unit 240 in the third direction, thereby moving the connection unit 130 in the first and second directions.

The operational mechanism between the connection unit 130 and the adjustment unit 240 will be described in detail with reference to FIGS. 6 and 7.

On the assumption that the connection unit 130 is inserted into the receiving hole 210*a*, the connection unit 130 moves in the first direction when the adjustment unit 240 moves in the third direction in the state of being in contact with the connection unit 130. When the contact part 241 moves in the third direction in the state of being in contact with the adjustment correspondence part 137, the connection unit 130 moves in the first direction. The adjustment correspondence part 137 includes an inclined surface 137*a* formed by further recessing the surface of the connection body 133 in the second direction. The adjustment correspondence part 137 includes an inclined surface 137*b* formed by further recessing the surface of the connection body 133 in the first direction. The contact part 241 includes an inclined surface configured to contact one of the inclined surfaces 137*a* and 137*b*. When the adjustment unit 240 moves in the third direction in the state in which the contact part 241 contacts one of the inclined surfaces 137*a* and 137*b*, the contact part 241 slides relative to one of the inclined surfaces 137*a* and 137*b*. On the assumption that the connection unit 130 is inserted into the receiving hole 210*a*, the adjustment correspondence part 137 includes an inclined surface configured to slide relative to the contact part 241 as the contact part 241 moves in the third direction.

The adjustment unit 240 includes an inclined surface inclined from the central axis of the adjustment unit hole at an angle corresponding to the inclined surface 137*a* and an inclined surface inclined from the central axis of the adjustment unit hole at an angle corresponding to the inclined surface 137*b*. On the assumption that the connection unit 130 is inserted into the receiving hole 210*a*, the connection unit 130 includes inclined surfaces 137*a* and 137*b* that contact the inclined surface of the contact part 241.

FIGS. 6 and 7 exaggeratedly show fine movement of the adjustment unit 240 and the connection unit 130. It is also possible to adjust the magnitude of the force applied to the adjustment correspondence part 137 of the connection unit 130 in the first direction as the adjustment unit 240 finely moves in the third direction. In order to enable fine adjustment of the distance between the adjustment unit 240 and the connection unit 130, the adjustment unit 240 may move in the state in which the contact part 241 contacts the inclined surface 137a.

Referring to FIG. 6, when the adjustment unit 240 moves in the third direction, as indicated by an arrow A1, the connection unit moves in the first direction, as indicated by an arrow B1, while the inclined surface of the contact part 241 slides relative to the inclined surface 137a of the adjustment correspondence part 137. In this case, the distance g between the receiving unit 210 and the guide unit 110 is decreased. That is, the distance g between the portions of the two adjacent display modules 1a and 1b at which the first fixing unit 110 and the second fixing unit of FIG. 6 are disposed is decreased.

Referring to FIG. 7, when the adjustment unit 240 moves in the third direction, as indicated by an arrow A2, the connection unit moves in the second direction, as indicated by an arrow B2, while the inclined surface of the contact part 241 slides relative to the inclined surface 137a of the adjustment correspondence part 137. In this case, the distance g between the receiving unit 210 and the guide unit 110 is increased. That is, the distance g between the two adjacent display modules 1a and 1b may be increased. That is, the distance g between the portions of the two adjacent display modules 1a and 1b at which the first fixing unit 110 and the second fixing unit of FIG. 6 are disposed is increased.

The operational mechanism between the connection unit 130 and the catching unit 150 will be described in detail with reference to FIGS. 6 to 8.

Referring to FIGS. 6 and 7, the connection unit 130 is disposed at the first position. At this time, the catching end part 151 of the catching unit 150 is inserted into the first catching recess 130c. In this case, the connection unit 130 is not freely movable along the guide hole 110a in the first and second directions, even in the state in which the connection unit 130 is not inserted into the receiving hole 210a. Since the interface between the catching end part 151 and the first catching recess 130c is curved, the catching end part 151 may escape from the first catching recess 130c when force having more than a predetermined magnitude is applied in the second direction. In this case, the catching end part 151 moves relative to the connection unit 130 along the main groove 130a.

Referring to FIG. 8, the connection unit 130 is disposed at the second position. At this time, the catching end part 151 of the catching unit 150 is inserted into the second catching recess 130b. In this case, the connection unit 130 is not freely movable along the guide hole 110a in the first and second directions even in the state in which the connection unit 130 is not inserted into the receiving hole 210a. Since the interface between the catching end part 151 and the second catching recess 130b is curved, the catching end part 151 may escape from the second catching recess 130b when force of more than a predetermined magnitude is applied in the first direction. In this case, the catching end part 151 moves relative to the connection unit 130 along the main groove 130a.

The display module, in which the first fixing unit 100 and the second fixing unit 200 are disposed at the side thereof in the X-axis direction and the side thereof in the Y-axis direction, will be described with reference to FIGS. 1 and 2.

Referring to FIGS. 1 and 2, a first X-axis fixing unit 100a or 100b includes an X-axis connection unit 130, an X-axis guide unit 110, and an X-axis adjustment unit 240. A first Y-axis fixing unit 100c or 100d includes a Y-axis connection unit 130, a Y-axis guide unit 110, and a Y-axis adjustment unit 240. A second X-axis fixing unit 200a or 200b includes an X-axis receiving unit 210 and an X-axis adjustment unit 240. A second Y-axis fixing unit 200c or 200d includes a Y-axis receiving unit 210 and a Y-axis adjustment unit 240.

Referring to FIGS. 1 and 2, the display module 1 includes an X-axis connection unit 130 disposed at the end of the support frame 30 in the positive X-axis direction and protruding in the positive X-axis direction and a Y-axis connection unit 130 disposed at the end of the support frame 30 in the positive Y-axis direction and protruding in the positive Y-axis direction. The display module 1 includes an X-axis receiving unit 210 disposed at the end of the support frame 30 in the negative X-axis direction. The X-axis receiving unit 210 includes an X-axis receiving hole 210a formed deeply in the positive X-axis direction. The display module 1 includes a Y-axis receiving unit 210 disposed at the end of the support frame 30 in the negative Y-axis direction. The Y-axis receiving unit 210 includes a Y-axis receiving hole 210a formed deeply in the positive Y-axis direction. The display module 1 includes an X-axis adjustment unit 240 movable in the first vertical direction perpendicular to the X-axis direction. The X-axis adjustment unit 240 can be inserted into the side of the X-axis receiving hole 210a. The display module 1 includes a Y-axis adjustment unit 240 movable in the second vertical direction perpendicular to the Y-axis direction. The Y-axis adjustment unit 240 can be inserted into the side of the Y-axis receiving hole 210a. On the assumption that the X-axis connection unit 130 is inserted into the X-axis receiving hole 210a, the X-axis connection unit 130 moves in the X-axis direction when the X-axis adjustment unit 240 moves in the first vertical direction (i.e. the direction perpendicular to the X-axis direction) in the state of being in contact with the X-axis connection unit 130. On the assumption that the Y-axis connection unit 130 is inserted into the Y-axis receiving hole 210a, the Y-axis connection unit 130 moves in the Y-axis direction when the Y-axis adjustment unit 240 moves in the second vertical direction (i.e. the direction perpendicular to the Y-axis direction) in the state of being in contact with the Y-axis connection unit 130. The other constructions are the same as those described above, and therefore a description thereof will be omitted.

A display apparatus including two display modules 1 will be described with reference to FIGS. 1 and 4.

Referring to FIGS. 1 to 4, A display apparatus 1 includes a concerned module 1a and an adjacent module 1b. The concerned module 1a includes a connection unit 130 disposed at the end of the support frame 30 in the first direction. The connection unit 130 of the concerned module 1a protrudes in the first direction. The adjacent module 1b includes a receiving unit 210 disposed at the end of the support frame 30 in the second direction. The receiving unit 210 of the adjacent module 1b includes a receiving hole 210a, into which the connection unit 130 of the concerned module 1a is inserted. The adjacent module 1b includes an adjustment unit 240 movable in the third direction. The adjustment unit 240 of the adjacent module 1b can be inserted into the side of the receiving hole 210a of the adjacent module 1b. When the adjustment unit 240 of the adjacent module 1b moves in the third direction while being in contact with the connection unit 130 of the concerned module 1a in the state in which the connection unit 130 of the concerned module 1a is inserted into the receiving hole 210a of the adjacent module 1b, the connection unit 130 of the concerned module 1a moves in the first direction. The other constructions are the same as those described above, and therefore a description thereof will be omitted.

Referring to FIGS. 11A and 11B, a plurality of panel modules 11 is disposed so as to partition the vertical plane when viewed from the front. The panel modules 11 are disposed so as to occupy predetermined regions of the vertical plane. The panel modules 11 output images forward. When viewed from the front, the panel modules 11, disposed so as to occupy the predetermined regions, output images forward. The panel modules 11 are fixed to the support frame 30, which supports the panel modules 11. The panel modules 11 are fixed to the front surface of the panel support unit 31.

Referring to FIGS. 11A and 11B, when viewed from the front, each of the panel modules 11 may have a quadrangular shape. In this embodiment, the display panel 10 includes a first panel module 11a, a second panel module 11b, a third panel module 11c, and a fourth panel module 11d. The first to fourth panel modules 11a, 11b, 11c, and 11d are arranged in a lattice shape when viewed from the front. The first panel module 11a and the second panel module 11b are arranged so as to be adjacent to each other in the Y-axis direction. The third panel module 11c and the fourth panel module 11d are arranged so as to be adjacent to each other in the Y-axis direction. The first panel module 11a and the third panel module 11c are arranged so as to be adjacent to each other in the X-axis direction. The second panel module 11b and the fourth panel module 11d are arranged so as to be adjacent to each other in the X-axis direction.

Referring to FIGS. 11A and 11B, in order to adjust and fix the distance g1 or g2 between two adjacent panel modules 11 in a single display module 1, the present invention may be realized using a circuit connection unit 300. The present invention, which is related to fine adjustment of the distance between the panel modules using the circuit connection unit 300, may be applied for fine adjustment of the distance between two of the first to fourth panel modules 11a, 11b, 11c, and 11d.

Referring to FIG. 12A, in one example, a circuit connection unit 300a according to the present invention may be provided at only the first panel module 11a, selected from between the first panel module 11a and the second panel module 11b, which are adjacent to each other. In another example, circuit connection units 300a and 300b according to the present invention may be provided respectively at the first panel module 11a and the second panel module 11b, which are adjacent to each other. In a further example, circuit connection units 300a, 300b, 300c, and 300d according to the present invention may be provided respectively at the first to fourth panel modules 11a, 11b, 11c, and 11d.

Hereinafter, a display panel 10 including a first panel module 11a and a second panel module 11b arranged in the vertical plane (i.e. the plane parallel to the X axis and the Y axis) will be described. The display panel 10 may include a third panel module 11c arranged in the vertical plane in the direction (i.e. the X-axis direction) perpendicular to the arrangement direction (i.e. the Y-axis direction) with respect to the first panel module 11a.

Referring to FIGS. 11A and 11B, the panel module 11 may be an LED display panel. In this case, the panel module 11 includes a display board 11-1 disposed in the vertical plane. In addition, the panel module 11 includes a plurality of LEDs 11-2 arranged on the front surface of the display board 11-1.

Referring to FIGS. 11A to 12A, the LEDs 11-2 are fixed to the display board 11-1. The display board 11-1 may be a printed circuit board (PCB). The display board 11-1 of the panel module 11 defines the thickness of the panel module 11 in the forward-rearward direction. When viewed from the front, the display board 11-1 may have a quadrangular shape. A recess part 310 or a protrusion part 320, a description of which will follow, may be fixed to the display board 11-1. The display board 11-1 is fixed to the support frame 30, which supports the display board 11-1. The display board 11-1 is fixed to the front surface of the panel support unit 31. The LEDs 11-2 are fixed to the front of the display board 11-1. The LEDs 11-2 emit light forward.

Referring to FIG. 11A, the LEDs 11-2 may be arranged on the panel module 11 at predetermined intervals a in the Y-axis direction. The distance g1 between two LEDs 11-2 arranged while the interface between the two panel modules 11a and 11b, which are adjacent to each other in the Y-axis direction, is disposed between the LEDs 11-2 may be adjusted so as to be equal to the distance a. The distance g1 may be adjusted using the circuit connection unit 300. The distance g1 may be adjusted using at least one selected from between the circuit connection unit 300a of the first panel module 11a and the circuit connection unit 300b of the second panel module 11b.

Referring to FIG. 11A, the LEDs 11-2 may be arranged on the panel module 11 at predetermined intervals b in the X-axis direction. The distance g2 between two LEDs 11-2 arranged while the interface between the two panel modules 11a and 11c, which are adjacent to each other in the X-axis direction, is disposed between the LEDs 11-2 may be adjusted so as to be equal to the distance b. The distance g2 may be adjusted using the circuit connection unit 300. The distance g2 may be adjusted using at least one selected from between the circuit connection unit 300a of the first panel module 11a and the circuit connection unit 300c of the third panel module 11c.

FIG. 11B shows the state in which the panel modules 11a, 11b, 11c, and 11d are correctly arranged using the circuit connection units 300. In this case, the distance g1 is substantially equal to the distance a, and the distance g2 is substantially equal to the distance b.

Referring to FIGS. 11A to 11B, the LEDs 11-2 may also be arranged on the panel module 11 at predetermined intervals in the X-axis direction and the Y-axis direction. That is, the LEDs 11-2 may be arranged such that the distance a and the distance b are equal to each other. In this case, the distance g1 and the distance g2 may be adjusted so as to be equal to each other.

Referring to FIGS. 11A to 11B, each of the first and second panel modules 11a and 11b includes a display board 11-1 disposed in the vertical plane and a plurality of LEDs 11-2 arranged on the front surface of the display board 11-1. The LEDs 11-2 of the first panel module 11a are arranged at predetermined intervals a in the direction in which the first panel module 11a and the second panel module 11b are arranged (i.e. the Y-axis direction). The LEDs 11-2 of the second panel module 11b are arranged at predetermined intervals a in the direction in which the first panel module 11a and the second panel module 11b are arranged (i.e. the Y-axis direction).

Referring to FIGS. 12A to 16B, the circuit connection unit 300 interconnects the control unit 40 and the panel module 11 via circuits. The circuit connection unit 300 movably fixes the panel module 11 to the control unit 40. The circuit connection unit 300 allows the panel module 11 to move relative to the control unit 40 within a predetermined movable range and prevents the panel module 11 from moving relative to the control unit 40 out of the predetermined movable range. The control unit 40 may transmit an image output control signal to the panel module 11 via the circuit connection unit 300. Circuit lines 11-2, 315, and 43 of FIG. 14 are provided such that a control signal from the control board 41 is transmitted to the LEDs 11-2.

Referring to FIGS. 12A to 13, the circuit connection unit 300 includes a recess part 310 fixed to one selected from between the control unit 40 and the panel module 11 and a protrusion part 320 fixed to the other selected from between the control unit 40 and the panel module 11. The protrusion part 320 is inserted into the recess part 310 to interconnect the control unit 40 and the panel module 11 via circuits.

Referring to FIGS. 12A and 12B, a plurality of circuit connection units 300a, 300b, 300c, and 300d may be provided. The circuit connection units 300a, 300b, 300c, and 300d may be disposed respectively between the panel modules 11a, 11b, 11c, and 11d and the control board 41. The circuit connection unit 300 may also be disposed only between the first control module 11a and the control board 41. The display apparatus 1 includes a first circuit connection unit 300a disposed between the first control module 11a and the control board 41. The display apparatus 1 may include a second circuit connection unit 300b disposed between the second control module 11b and the control board 41. The display apparatus 1 may include a third circuit connection unit 300c disposed between the third control module 11c and the control board 41. The display apparatus 1 may include a fourth circuit connection unit 300d disposed between the fourth control module 11d and the control board 41. The circuit connection unit 300 includes a recess part 310 fixed to one selected from between the control unit 40 and the panel module 11 and a protrusion part 320 fixed to the other selected from between the control unit 40 and the panel module 11.

Specifically, the display module 1 includes a first recess part 310a fixed to one selected from between the control unit 40 and the first panel module 11a and a first protrusion part 320a fixed to the other selected from between the control unit 40 and the first panel module 11a. The first protrusion part 320a is inserted into the first recess part 310a. The first protrusion part 320a is inserted into the first recess part 310a and movably fixed. The first protrusion part 320a is inserted into the first recess part 310a to interconnect the control unit 40 and the first panel module 11a via circuits. The first panel module 11a is disposed in the vertical plane (i.e. the plane in which the first panel module 11a is disposed) so as to be movable relative to the control unit 40 in the state in which the first protrusion part 320a is inserted into the first recess part 310a.

In addition, the display module 1 may further include a second recess part 310b fixed to one selected from between the control unit 40 and the second panel module 11b and a second protrusion part 320b fixed to the other selected from between the control unit 40 and the second panel module 11b. The second protrusion part 320b is inserted into the second recess part 310b. The second protrusion part 320b is inserted into the second recess part 310b and movably fixed. The second protrusion part 320b is inserted into the second recess part 310b to interconnect the control unit 40 and the second panel module 11b via circuits. The second panel module 11b is disposed in the vertical plane so as to be movable relative to the control unit 40 in the state in which the second protrusion part 320b is inserted into the second recess part 310b.

In addition, the display module 1 may further include a third recess part 310c fixed to one selected from between the control unit 40 and the third panel module 11c and a third protrusion part 320c fixed to the other selected from between the control unit 40 and the third panel module 11c. The third recess part 310c and the third protrusion part 320c are identical to the first recess part 310a and the first protrusion part 320a, respectively, and therefore a description thereof will be omitted.

In addition, the display module 1 may further include a fourth recess part 310d fixed to one selected from between the control unit 40 and the fourth panel module 11d and a fourth protrusion part 320d fixed to the other selected from between the control unit 40 and the fourth panel module 11d. The fourth recess part 310d and the fourth protrusion part 320d are identical to the first recess part 310a and the first protrusion part 320a, respectively, and therefore a description thereof will be omitted.

FIGS. 12A and 12B are perspective views showing only the display panel 10, the control board 41, and the circuit connection unit 300 with the other constructions, including the support frame 30, being omitted. FIG. 12A shows the panel modules 11a, 11b, 11c, and 11d before the protrusion parts 320a, 320b, 320c, and 320d are inserted respectively into the recess parts 310a, 310b, 310c, and 310d. FIG. 12B shows the panel modules 11a, 11b, 11c, and 11d after the protrusion parts 320a, 320b, 320c, and 320d are inserted respectively into the recess parts 310a, 310b, 310c, and 310d. Referring to FIG. 12B, the panel modules 11 are movable in the vertical plane (i.e. the plane parallel to the X axis and the Y axis) in the state in which the first to fourth protrusion parts 320a, 320b, 320c, and 320d are inserted respectively into the first to fourth recess parts 310a, 310b, 310c, and 310d.

In the state in which the first protrusion part 320a is inserted into the first recess part 310a, the first panel module 11a is movable in the direction in which the first panel module 11a and the second panel module 11b are arranged (i.e. the Y-axis direction) within a movable range. In the state in which the first protrusion part 320a is inserted into the first recess part 310a, the first panel module 11a is movable in the direction in which the first panel module 11a and the third panel module 11c are arranged (i.e. the X-axis direction) within a movable range.

In addition, in the state in which the second protrusion part 320b is inserted into the second recess part 310b, the second panel module 11b is movable in the direction in which the second panel module 11b and the first panel module 11a are arranged (i.e. the Y-axis direction) within a movable range. In the state in which the third protrusion part 320c is inserted into the third recess part 310c, the third panel module 11c is movable in the direction in which the third panel module 11c and the first panel module 11a are arranged (i.e. the X-axis direction) within a movable range.

The protrusion part 320 is fixed to one selected from the panel module 11 and the control board 41 and protrudes in the direction in which the protrusion part 320 faces the other selected from the panel module 11 and the control board 41. The recess part 310 is fixed to the other selected from the panel module 11 and the control board 41 and has an insertion space 317 that is open in the direction in which the recess part 310 faces the one selected from the panel module 11 and the control board 41.

Referring to FIG. 12A, in this embodiment, the protrusion part 320 protrudes rearward from the panel module 11, and the recess part 310 is fixed to the control unit 40. In this embodiment, the protrusion parts 320a, 320b, 320c, and 320d protrude rearward from the panel modules 11a, 11b, 11c, and 11d, respectively. The recess parts 310a, 310b, 310c, and 310d are fixed to the control unit 40. The protrusion parts 320a, 320b, 320c, and 320d are inserted into the recess parts 310a, 310b, 310c, and 310d, respectively, to interconnect the control unit 40 and the panel modules 11a, 11b, 11c, and 11d via circuits. The panel modules 11a, 11b, 11c, and 11d are movable in the vertical plane (i.e. the plane parallel to the X axis and the Y axis) in the state in which the protrusion parts 320a, 320b, 320c, and 320d are inserted into the recess parts 310a, 310b, 310c, and 310d, respectively.

Referring to FIG. 12A, in this embodiment, the first protrusion part 320a protrudes rearward from the rear surface of the first panel module 11a. The second protrusion part 320b protrudes rearward from the rear surface of the second panel module 11b. The third protrusion part 320c protrudes rearward from the rear surface of the third panel module 11c. The fourth protrusion part 320d protrudes rearward from the rear surface of the fourth panel module 11d.

Referring to FIG. 12A, in this embodiment, the first recess part 310a is disposed at the front of the control unit 40. The second recess part 310b is disposed at the front of the control unit 40. The third recess part 310c is disposed at the front of the control unit 40. The fourth recess part 310d is disposed at the front of the control unit 40.

Hereinafter, a description of the first recess part 310a may be applied to at least one of the first to fourth recess parts 310a, 310b, 310c, and 310d, and a description of the first protrusion part 320a may be applied to at least one of the first to fourth protrusion parts 320a, 320b, 320c, and 320d.

Referring to FIGS. 11A, 11B, 13, 14, 16A and 16B, the first panel module 11a is movable in the direction in which the first panel module 11a and the second panel module 11b are arranged (i.e. the Y-axis direction) in the state in which the first protrusion part 320a is inserted into the first recess part 310a. The first panel module 11a is movable in the direction (i.e. the X-axis direction) perpendicular to the arrangement direction (i.e. the Y-axis direction) in the state in which the first protrusion part 320a is inserted into the first recess part 310a.

Referring to FIGS. 13 to 16B, the first recess part 310a includes a moving part 313 defining an insertion space 317, into which the first protrusion part 320a is inserted. In addition, the first recess part 310a includes a recess part cabinet 311 for receiving the moving part 313 therein. The recess part cabinet 311 is configured such that the moving part 313 is movable in the vertical plane.

Referring to FIGS. 14 to 16B, the recess part cabinet 311 is fixed to one selected from the rear surface of the panel module 11 and the front surface of the control board 41. The rear surface of the recess part cabinet 311 may be fixed to the control board 41 in the state of being in contact with the control board 41. The recess part cabinet 311 may be open in the direction facing the first protrusion part 320a (i.e. forward). The recess part cabinet 311 may surround the moving part 313 in the vertical plane (i.e. the plane parallel to the X axis and the Y axis).

Referring to FIGS. 14 to 16B, the moving part 313 defines the insertion space 317. The insertion space 317 may be open in the direction in which the first protrusion part 320a is disposed and may be closed in the X-axis direction and the Y-axis direction. The moving part 313 may surround the first protrusion part 320a in the vertical plane (i.e. the plane parallel to the X axis and the Y axis).

Referring to FIGS. 14 to 16B, the moving part 313 contacts opposite side surfaces of the first protrusion part 320a in the Y-axis direction. When the first panel module 11a is moved in the Y-axis direction in the state in which the first protrusion part 320a is inserted into the moving part 313, the moving part 313 and the first protrusion part 320a move simultaneously in the Y-axis direction.

Referring to FIGS. 14 to 16B, the moving part 313 contacts opposite side surfaces of the first protrusion part 320a in the X-axis direction. When the first panel module 11a is moved in the X-axis direction in the state in which the first protrusion part 320a is inserted into the moving part 313, the moving part 313 and the first protrusion part 320a move simultaneously in the X-axis direction.

Referring to FIGS. 14 to 16B, the recess part cabinet 311 receives the moving part 313 therein. The recess part cabinet 311 may be fixedly disposed on the control board 41. The recess part cabinet 311 allows the moving part 313 to move in a limited direction and within a limited range.

Referring to FIGS. 14 to 16B, the recess part cabinet 311 may have opposite side surfaces spaced apart from the opposite side surfaces of the moving part 313 in the Y-axis direction. Referring to FIG. 14, the recess part cabinet 311 may be spaced apart from the opposite side surfaces of the moving part 313 in the Y-axis direction to define a moving space 318. The recess part cabinet 311 may have opposite side surfaces spaced apart from the opposite side surfaces of the moving part 313 in the X-axis direction.

Referring to FIGS. 3 and 14 to 16B, the support frame 30 includes a opening 30a, in which the circuit connection unit 300 is disposed. The support frame 30 includes a opening 30a, in which at least one selected from the first recess part 310a and the first protrusion part 320a is disposed. The first protrusion part 320a extends through the opening 30a. At least a portion of the first recess part 310a may be disposed in the opening 30a. The opening 30a may be formed in the panel support unit 31.

The construction of the circuit connection unit 300 will be described with reference to FIGS. 14 to 16B.

Referring to FIGS. 14 to 16B, the panel module 11 includes a display circuit 11-3 for electrically connecting the LEDs 11-2 to a display circuit terminal 11-3a. The display circuit 11-3 is disposed on the display board 11-1, and is connected to the LEDs 11-2. The display circuit terminal 11-3a is electrically connected to a moving circuit 315 when the first protrusion part 320a is inserted into the first recess part 310a. The display circuit terminal 11-3a is electrically disconnected from the moving circuit 315 when the first protrusion part 320a is separated from the first recess part 310a. The display circuit terminal 11-3a is disposed on the surface of a portion of the first protrusion part 320a that is inserted into the insertion space 317.

Referring to FIGS. 14 to 16B, the second recess part 310b includes a moving circuit 315 for maintaining electrical connection between the panel module 11 and the control unit 40 even when the first protrusion part 320a moves in the state of being inserted into the first recess part 310a. The moving circuit 315 includes a first moving circuit terminal 315a electrically connected to the display circuit 11-3. The moving circuit 315 includes a second moving circuit terminal 315b electrically connected to a control circuit 43. The moving circuit 315 electrically connects the first moving circuit terminal 315a and the second moving circuit terminal 315b to each other.

Referring to FIGS. 14 to 16B, the first moving circuit terminal 315a is disposed so as to correspond to the display circuit terminal 11-3a. The first moving circuit terminal 315a is electrically connected to the display circuit terminal 11-3a when the first protrusion part 320a is inserted into the first recess part 310a. The first moving circuit terminal 315a is electrically disconnected from the display circuit terminal 11-3a when the first protrusion part 320a is separated from the first recess part 310a. The first moving circuit terminal 315a is disposed on the inner surface of the insertion space 317.

Referring to FIGS. 14 to 16B, in this embodiment, the second moving circuit terminal 315b is disposed so as to be slidable together with a control circuit terminal 43a. Referring to FIGS. 16A and 16B, the second moving circuit terminal 315b and the control circuit terminal 43a may slide in the state of being in contact with each other even when the moving part 313 moves relative to the recess part cabinet 311 within a movable range.

Referring to FIGS. 14 to 16B, in another embodiment, the end of the moving circuit 315 adjacent to the second moving circuit terminal 315b may be flexible, and the second moving circuit terminal 315b may be fixedly connected to the control circuit terminal 43a. In this case, the end of the moving circuit 315 adjacent to the second moving circuit terminal 315b may be flexibly curved even when the moving part 313 moves relative to the recess part cabinet 311 within a movable range, whereby electrical connection between the moving circuit 315 and the control circuit 43 may be maintained.

Referring to FIGS. 14 to 16B, the control unit 40 includes a control circuit 43. The control circuit 43 electrically transmits a control signal (e.g. an electrical signal) from the control unit 40 to the moving circuit 315. The control circuit 43 includes a control circuit terminal 43a electrically connected to the second moving circuit terminal 315b. The control circuit terminal 43a is disposed in the recess part cabinet 311.

Referring to FIG. 14, the first protrusion part 320a may define a moving space 318 having a movable range d2 in the positive Y-axis direction, and may define a moving space 318 having a movable range d3 in the negative Y-axis direction. Referring to FIG. 16A, the first protrusion part 320a cannot move any further in the positive Y-axis direction when the first protrusion part 320a moves to the end of the movable range d2 in the positive Y-axis direction. Referring to FIG. 16B, the first protrusion part 320a cannot move any further in the negative Y-axis direction when the first protrusion part 320a moves to the end of the movable range d3 in the negative Y-axis direction.

Referring to FIGS. 14 to 16B, the recess part cabinet 311 may be spaced apart from the opposite side surfaces of the moving part 313 in the X-axis direction to define a moving space 318. The first protrusion part 320a may define a moving space 318 having a predetermined movable range in the positive X-axis direction, and may define a moving space 318 having a predetermined movable range in the negative X-axis direction. The first protrusion part 320a cannot move any further in the positive X-axis direction when the first protrusion part 320a moves to the end of the predetermined movable range in the positive X-axis direction. The first protrusion part 320a cannot move any further in the negative X-axis direction when the first protrusion part 320a moves to the end of the predetermined movable range in the negative X-axis direction.

Referring to FIGS. 14 to 16B, the moving part 313 may move while sliding relative to the recess part cabinet 311. The recess part cabinet 311 may include a guide (not shown) for guiding the movement of the moving part 313. The guide of the recess part cabinet 311 may guide the movement of the moving part 313 in the X-axis direction. The guide of the recess part cabinet 311 may guide the movement of the moving part 313 in the Y-axis direction.

Referring to FIGS. 14 to 16B, the recess part cabinet 311 may include a stopper (not shown) for limiting the movable range of the moving part 313. In one example, the stopper of the recess part cabinet 311 may contact the side surface of the moving part 313 to limit the movement of the moving part 313. In another example, the stopper of the recess part cabinet 311 may contact the side surface of the first protrusion part 320a to limit the movement of the moving part 313, which moves together with the first protrusion part 320a. Referring to FIG. 14, a stopper, spaced apart from the side surface of the first protrusion part 320a in the positive Y-axis direction by a predetermined distance d4 so as to directly contact the side surface of the first protrusion part 320a in the positive Y-axis direction, is disposed in the recess part cabinet 311. Referring to FIG. 14, a stopper, spaced apart from the side surface of the first protrusion part 320a in the negative Y-axis direction by a predetermined distance d5 so as to directly contact the side surface of the first protrusion part 320a in the negative Y-axis direction, is disposed in the recess part cabinet 311.

Referring to FIGS. 12A to 12B, the first recess part 310a may be configured such that the distance (the sum of d2 and d3) that the first panel module 11a is movable in the direction in which the first panel module 11a and the second panel module 11b are arranged (i.e. the Y-axis direction) is greater than a predetermined distance d1 by which the LEDs 11-2 are spaced apart from each other in the arrangement direction (i.e. the Y-axis direction) in the state in which the first protrusion part 320a is inserted into the first recess part 310a. In this embodiment, the distance d2+d3 may be set to about 2 to 4 times the distance d1.

As is apparent from the above description, in the present invention, the connection unit and the receiving unit are provided, whereby it is possible to easily perform fine distance adjustment while fastening a plurality of display modules.

In addition, a plurality of connection units is arranged along one end of the support frame, and a plurality of receiving units is arranged along the other end of the support frame, whereby it is possible to easily perform distance adjustment when the distances between one display module and another display module at various points at the interface therebetween differ from each other.

In addition, no additional fastening members are needed in addition to the display modules, whereby there is no risk of losing the fastening members and it is not necessary to handle the fastening members.

In addition, when the connection unit is not connected to an adjacent display module, the connection unit is configured to be movable so as not to be outwardly visible.

In addition, the connection unit is caught by the catching unit at a specific position. Consequently, it is possible to perform fine adjustment in the state in which a plurality of display modules is disposed and fixed, thereby improving the efficiency in connection between the display modules.

In addition, it is possible to easily perform fine distance adjustment between the panel modules while coupling the panel modules to the control unit using the circuit connection unit.

In addition, it is possible to connect the panel modules to the control unit via circuits using the recess unit and the protrusion unit and to perform fine distance adjustment and finally dispose and fix the positions of the panel modules in the state in which the panel modules are structurally coupled to the control unit, thereby accurately manufacturing the display module so as to have a predetermined fine distance.

In addition, it is possible to perform fine adjustment in the state in which the panel modules are disposed and fixed, thereby improving the efficiency in assembly of the panel modules.

In addition, the panel modules are connected to the control unit without additional circuit connection members, such as cables, whereby there is no risk of losing the circuit connection members, and it is not necessary to handle the circuit connection members.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A display apparatus comprising:
   a display panel;
   a support frame disposed at a rear of the display panel and configured to support the display panel;
   a connection unit disposed at a first side of the support frame in a first direction and configured to protrude in the first direction;
   a receiving unit disposed at a second side of the support frame in a second direction opposite the first direction and shaped to comprise a receiving hole depressed in the first direction; and
   an adjustment unit configured to be inserted into the receiving unit in a third direction perpendicular to the first direction,
   wherein, on an assumption that an adjacent connection unit of an adjacent display apparatus is inserted into the receiving hole, the adjustment unit is configured to move the adjacent connection unit inserted into the receiving hole, in one of the first or second directions along the receiving hole as the adjustment unit moves in the third direction in a state of being in contact with the adjacent connection unit inserted into the receiving hole.

2. The display apparatus according to claim 1, wherein the display apparatus further comprises:
   a plurality of connection units arranged along the first side of the support frame; and
   a plurality of receiving units arranged along the second side of the support frame and disposed at positions along the second side corresponding to positions of the plurality of connection units on the first side.

3. The display apparatus according to claim 1, wherein:
   the adjustment unit comprises a first inclined surface that faces a direction between a direction in which the adjustment unit is inserted and the first direction, and
   the connection unit comprises a corresponding second inclined surface configured to contact a first inclined surface of another adjacent display apparatus on an assumption that the connection unit is inserted into the receiving hole of the another adjacent display apparatus.

4. The display apparatus according to claim 1, wherein the adjustment unit comprises a tapered contact part at an end in a direction in which the adjustment unit is inserted, and
   the connection unit comprises an inclined surface that slides relative to a contact part of an adjustment unit of another adjacent display apparatus as the adjustment unit of the another adjacent display apparatus moves in the third direction on an assumption that the connection unit is inserted into the receiving hole of the another adjacent display apparatus.

5. The display apparatus according to claim 4, wherein the connection unit comprises an adjustment correspondence part configured to contact the contact part on an assumption that the connection unit is inserted into the receiving hole, the adjustment correspondence part comprising a first inclined surface and an opposite second inclined surface at a recessed portion of a side of the connection unit.

6. The display apparatus according to claim 1, further comprising a guide unit configured to guide movement of the connection unit in the first and second direction.

7. The display apparatus according to claim 6, further comprising a catching unit disposed perpendicular to the first direction and configured to fix a position of the connection unit with respect to the guide unit.

8. The display apparatus according to claim 7, wherein the connection unit comprises a main groove extending in the first and second direction configured to guide the catching unit.

9. The display apparatus according to claim 7, wherein the connection unit comprises:
   a first catching recess configured to engage with the catching unit such that the connection unit is fixed at a first position with respect to the guide unit; and
   a second catching recess configured to engage with the catching unit such that the connection unit is fixed at a second position with respect to the guide unit,
   wherein the connection unit protrudes further in the first direction from the guide unit at the first position than at the second position.

10. The display apparatus according to claim 7, wherein the catching unit comprises:
    a catching body supported by the guide unit;
    a catching end part configured to contact the connection unit; and
    an elastic member configured to bias the catching end part away from the catching body.

11. A display apparatus comprising two display modules each comprising a display panel and a support frame disposed at a rear of the corresponding display panel for supporting the display panel, wherein:
    a first display module of the two display modules comprises a connection unit disposed at a first side of a first support frame of the first display module in a first direction and configured to protrude in the first direction;
    a second display module of the two display modules comprises:
      a receiving unit disposed at a second side of a second support frame of the second display module in a second direction opposite the first direction and shaped to comprise a receiving hole configured to receive the connection unit in the first direction; and
      an adjustment unit configured to be inserted into the receiving unit in a third direction perpendicular to the first direction, and
    the adjustment unit is configured to cause the connection unit to move along the receiving hole as the adjustment unit moves in the third direction in a state of being in contact with the connection unit.

12. A display apparatus comprising:
    a display panel comprising a first panel module and an adjacent a second panel module arranged in an imaginary vertical plane;
    a control unit disposed at a rear of the display panel and configured to control the display panel to display information;

a first recess part fixed to one of the control unit or the first panel module; and a first protrusion part fixed to the other of the control unit or the first panel module, wherein the first protrusion part is configured to be inserted into the first recess part to electrically couple the control unit and the first panel module, wherein the first recess part is configured to allow movement of the first panel module relative to the control unit in the vertical plane while the first protrusion part is inserted into the first recess part, and wherein the first recess part is further configured to allow movement of the first panel module in a first direction in which the first panel module and the second panel module are arranged.

13. The display apparatus according to claim 12, further comprising:

a second recess part fixed to one of the control unit or the second panel module; and a second protrusion part fixed to the other of the control unit or the second panel module, wherein the second protrusion part is configured to be inserted into the second recess part to electrically couple the control unit and the second panel module, and wherein the second recess part is configured to allow movement of the second panel module relative to the control unit in the vertical plane while the second protrusion part is inserted into the second recess part.

14. The display apparatus according to claim 13, wherein:

the first protrusion part protrudes from a rear surface of the first panel module;

the second protrusion part protrudes from a rear surface of the second panel module; and the first recess part and the second recess part are disposed at a front surface of the control unit.

15. The display apparatus according to claim 12, further comprising:

a support frame disposed at a rear of the display panel and configured to support the display panel, wherein the support frame comprises an opening in which at least the first recess part or the first protrusion part is disposed.

16. The display apparatus according to claim 12, wherein the first recess part is further configured to allow movement of the first panel module in a second direction perpendicular to the first direction.

17. The display apparatus according to claim 16, wherein the display panel further comprises a third panel module arranged with respect to the first panel module in the second direction in the vertical plane.

18. The display apparatus according to claim 12, wherein:

the first panel module comprises a first display board and a first plurality of light emitting diodes (LEDs) arranged at a front surface of the first display board;

the second panel module comprises a second display board and a second plurality of LEDs arranged at a front surface of the second display board;

the first plurality of LEDs are spaced apart from each other by a predetermined distance in a first direction in which the first panel module and the second panel module are arranged;

the second plurality of LEDs are spaced apart from each other by the predetermined distance in the first direction; and the first recess part is further configured to allow movement of the first panel module in the first direction greater than the predetermined distance.

19. The display apparatus according to claim 12, wherein the first recess part comprises:

a moving part comprising an insertion space configured to accommodate the first protrusion part; and a recess part cabinet configured to accommodate the moving part and allow movement of the moving part in the vertical plane.

* * * * *